US011057004B2

(12) United States Patent
Kim et al.

(10) Patent No.: US 11,057,004 B2
(45) Date of Patent: Jul. 6, 2021

(54) MULTIBAND DIGITAL PREDISTORTER

(71) Applicant: NanoSemi, Inc, Waltham, MA (US)

(72) Inventors: Helen H. Kim, Sudbury, MA (US);
Alexandre Megretski, Concord, MA (US); Yan Li, Lexington, MA (US);
Kevin Chuang, Cambridge, MA (US);
Zohaib Mahmood, Westwood, MA (US); Yanyu Huang, Bedford, MA (US)

(73) Assignee: NanoSemi, Inc., Waltham, MA (US)

( * ) Notice: Subject to any disclaimer, the term of this patent is extended or adjusted under 35 U.S.C. 154(b) by 0 days.

(21) Appl. No.: 16/487,969

(22) PCT Filed: Feb. 23, 2018

(86) PCT No.: PCT/US2018/019481
§ 371 (c)(1),
(2) Date: Aug. 22, 2019

(87) PCT Pub. No.: WO2018/156932
PCT Pub. Date: Aug. 30, 2018

(65) Prior Publication Data
US 2020/0028476 A1    Jan. 23, 2020

Related U.S. Application Data

(60) Provisional application No. 62/463,616, filed on Feb. 25, 2017.

(51) Int. Cl.
*H03F 1/32* (2006.01)
*H03F 3/24* (2006.01)
(Continued)

(52) U.S. Cl.
CPC ............. *H03F 1/3247* (2013.01); *H03F 3/24* (2013.01); *H03F 3/68* (2013.01); *H04B 1/0067* (2013.01);
(Continued)

(58) Field of Classification Search
CPC . H03F 1/3247; H03F 3/24; H03F 3/68; H04B 1/0067; H04B 1/0475
See application file for complete search history.

(56) References Cited

U.S. PATENT DOCUMENTS 4,979,126 A   12/1990   Pao et al.
5,819,165 A   10/1998   Hulkko et al.
(Continued)

FOREIGN PATENT DOCUMENTS

CN   101379718 A   3/2009
CN   101971507 A   2/2011
(Continued)

OTHER PUBLICATIONS

R. N. Braithwaite, "Implementing crest factor reduction (CFR) by offsetting digital predistortion (DPD) coefficients," 2012 Workshop on Integrated Nonlinear Microwave and Millimetre-wave Circuits, Dublin, 2012, pp. 1-3, doi: 10.1109/INMMIC.2012.6331928. (Year: 2012).*

(Continued)

*Primary Examiner* — Jaison Joseph
(74) *Attorney, Agent, or Firm* — Occhiuti & Rohlicek LLP

(57) ABSTRACT

Disclosed are methods, systems, devices, apparatus, media, design structures, and other implementations, including a method for digital predistortion of multiband signals that includes receiving a plurality of input signals respectively associated with multiple radio frequency (RF) bands, with the plurality of input signals occupying an input frequency (Continued)

span corresponding to a difference between a maximum frequency in a highest of the multiple RF bands and a minimum frequency in a lowest of the multiple RF bands. The method further includes frequency shifting at least one signal from the plurality of input signals to produce condensed shifted signals, each corresponding to a respective one of the plurality of input signals, occupying a condensed frequency span smaller than the input frequency span, and processing the condensed shifted signals, including applying digital predistortion to the condensed shifted signals.

21 Claims, 8 Drawing Sheets

(51) Int. Cl.
 *H03F 3/68* (2006.01)
 *H04B 1/00* (2006.01)
 *H04B 1/04* (2006.01)

(52) U.S. Cl.
 CPC ...... *H04B 1/0475* (2013.01); *H03F 2200/111* (2013.01); *H03F 2200/451* (2013.01); *H04B 2001/0425* (2013.01)

(56) References Cited

U.S. PATENT DOCUMENTS

| | | |
|---|---|---|
| 5,980,457 A | 11/1999 | Averkiou |
| 6,052,412 A | 4/2000 | Ruether et al. |
| 6,240,278 B1 | 5/2001 | Midya et al. |
| 6,288,610 B1 | 9/2001 | Miyashita |
| 6,549,067 B1 | 4/2003 | Kenington |
| 7,170,344 B2 | 1/2007 | Suzuki et al. |
| 7,289,773 B2 | 10/2007 | Braithwaite |
| 7,295,815 B1 | 11/2007 | Wright et al. |
| 7,321,264 B2 | 1/2008 | Kokkeler |
| 7,333,557 B2 | 2/2008 | Rashev et al. |
| 7,469,491 B2 | 12/2008 | McCallister et al. |
| 7,529,652 B1 | 5/2009 | Gahinet et al. |
| 7,577,211 B2 | 8/2009 | Braithwaite |
| 7,599,431 B1 | 10/2009 | Anderson et al. |
| 7,634,238 B2 | 12/2009 | Suzuki et al. |
| 7,796,960 B1 | 9/2010 | Rashev et al. |
| 7,904,033 B1 | 3/2011 | Wright et al. |
| 8,121,560 B1 | 2/2012 | Anaraki et al. |
| 8,185,066 B2 | 5/2012 | Camp, Jr. et al. |
| 8,306,149 B2 | 11/2012 | Mujica et al. |
| 8,391,809 B1* | 3/2013 | Fuller ............... H04B 1/0475 455/114.3 |
| 8,411,730 B2 | 4/2013 | Maeda |
| 8,446,979 B1 | 5/2013 | Yee |
| 8,498,590 B1 | 7/2013 | Rashev et al. |
| 8,519,789 B2 | 8/2013 | Hawkes |
| 8,576,941 B2 | 11/2013 | Bai |
| 8,644,437 B2 | 2/2014 | Kim et al. |
| 8,666,336 B1 | 3/2014 | Dick |
| 8,711,976 B2 | 4/2014 | Chandrasekaran |
| 8,731,005 B2 | 5/2014 | Schlee |
| 8,731,105 B2 | 5/2014 | Bai |
| 8,890,609 B2 | 11/2014 | Laporte |
| 9,071,207 B2 | 6/2015 | Bai |
| 9,130,628 B1 | 9/2015 | Mittal et al. |
| 9,173,173 B2 | 10/2015 | Wei et al. |
| 9,184,710 B2 | 11/2015 | Braithwaite |
| 9,226,189 B1 | 12/2015 | Kularatna et al. |
| 9,252,712 B2 | 2/2016 | Li et al. |
| 9,331,882 B2* | 5/2016 | Fehri ............... H04L 27/2623 |
| 9,337,782 B1 | 5/2016 | Mauer et al. |
| 9,564,876 B2 | 2/2017 | Kim et al. |
| 9,590,668 B1 | 3/2017 | Kim et al. |
| 9,595,920 B2 | 3/2017 | Li et al. |
| 9,614,557 B1 | 4/2017 | Mayer et al. |
| 9,621,236 B2 | 4/2017 | Ghannouchi et al. |
| 9,628,119 B2 | 4/2017 | Gal et al. |
| 9,722,646 B1 | 8/2017 | Matthews et al. |
| 9,749,161 B1 | 8/2017 | Gal et al. |
| 9,831,899 B1 | 11/2017 | Boghrat et al. |
| 9,935,810 B1 | 4/2018 | Hammler et al. |
| 9,973,370 B1 | 5/2018 | Langer et al. |
| 10,033,413 B2 | 7/2018 | Pratt |
| 10,033,414 B2 | 7/2018 | Ota |
| 10,079,699 B1 | 9/2018 | Li et al. |
| 10,080,178 B2 | 9/2018 | Stapleton et al. |
| 10,141,896 B2 | 11/2018 | Huang |
| 10,141,961 B1 | 11/2018 | Huang et al. |
| 10,181,914 B2 | 1/2019 | Li et al. |
| 10,404,296 B2 | 9/2019 | Kim et al. |
| 10,447,511 B2 | 10/2019 | Xie et al. |
| 10,469,109 B2 | 11/2019 | Gutman et al. |
| 10,523,159 B2 | 12/2019 | Megretski et al. |
| 10,581,470 B2 | 3/2020 | Megretski et al. |
| 10,623,118 B2 | 4/2020 | Lagoy et al. |
| 10,644,657 B1 | 5/2020 | Megretski et al. |
| 10,763,904 B2 | 9/2020 | Megretski et al. |
| 10,812,166 B2 | 10/2020 | Kim et al. |
| 10,826,739 B1 | 11/2020 | Fomin et al. |
| 2001/0050592 A1 | 12/2001 | Wright et al. |
| 2002/0080891 A1 | 6/2002 | Ahn et al. |
| 2003/0058960 A1 | 3/2003 | Lee |
| 2003/0184374 A1 | 10/2003 | Huang et al. |
| 2003/0207680 A1 | 11/2003 | Yang et al. |
| 2004/0076247 A1 | 4/2004 | Barak et al. |
| 2004/0116083 A1 | 6/2004 | Suzuki et al. |
| 2004/0121741 A1 | 6/2004 | Rashev et al. |
| 2004/0142667 A1 | 7/2004 | Lochhead et al. |
| 2004/0196922 A1 | 10/2004 | Leffel |
| 2005/0001684 A1 | 1/2005 | Braithwaite |
| 2005/0163251 A1 | 7/2005 | McCallister |
| 2005/0163252 A1 | 7/2005 | McCallister et al. |
| 2005/0180527 A1 | 8/2005 | Suzuki et al. |
| 2005/0190857 A1 | 9/2005 | Braithwaite |
| 2006/0022751 A1 | 2/2006 | Fuller et al. |
| 2006/0154622 A1 | 7/2006 | Piirainen |
| 2006/0229036 A1 | 10/2006 | Muller et al. |
| 2006/0276147 A1 | 12/2006 | Suzuki |
| 2007/0091992 A1 | 4/2007 | Dowling |
| 2007/0230557 A1 | 10/2007 | Balasubramonian et al. |
| 2007/0241812 A1 | 10/2007 | Yang et al. |
| 2008/0003945 A1 | 1/2008 | Wenham |
| 2008/0019453 A1 | 1/2008 | Zhao et al. |
| 2008/0039045 A1 | 2/2008 | Filipovic et al. |
| 2008/0057882 A1 | 3/2008 | Singerl |
| 2008/0101502 A1 | 5/2008 | Navidpour et al. |
| 2008/0247487 A1 | 10/2008 | Cai et al. |
| 2008/0260066 A1 | 10/2008 | Cai et al. |
| 2008/0268794 A1 | 10/2008 | Mege et al. |
| 2008/0268795 A1 | 10/2008 | Saed |
| 2008/0285640 A1 | 11/2008 | McCallister |
| 2009/0201084 A1* | 8/2009 | See ............... H03F 1/0261 330/51 |
| 2010/0026354 A1 | 2/2010 | Utsunomiya et al. |
| 2010/0048149 A1 | 2/2010 | Tang et al. |
| 2010/0225390 A1 | 9/2010 | Brown et al. |
| 2010/0297966 A1 | 11/2010 | Row et al. |
| 2011/0044158 A1 | 2/2011 | Tao et al. |
| 2011/0085490 A1 | 4/2011 | Schlee |
| 2011/0098011 A1 | 4/2011 | Camp, Jr. et al. |
| 2011/0128992 A1 | 6/2011 | Maeda et al. |
| 2011/0135035 A1 | 6/2011 | Bose et al. |
| 2011/0150130 A1 | 6/2011 | Kenington |
| 2011/0163806 A1 | 7/2011 | Hongo |
| 2011/0187437 A1 | 8/2011 | Perreault et al. |
| 2011/0235734 A1 | 9/2011 | Kenington |
| 2011/0255627 A1 | 10/2011 | Gotman et al. |
| 2011/0273234 A1 | 11/2011 | Van der Heijen et al. |
| 2011/0273236 A1 | 11/2011 | Heijden et al. |
| 2012/0093210 A1 | 4/2012 | Schmidt et al. |
| 2012/0108189 A1 | 5/2012 | McCallister et al. |
| 2012/0119810 A1 | 5/2012 | Bai |
| 2012/0119811 A1 | 5/2012 | Bai et al. |
| 2012/0119831 A1 | 5/2012 | Bai |
| 2012/0154033 A1 | 6/2012 | Lozhkin |

(56) References Cited

U.S. PATENT DOCUMENTS

| | | | |
|---|---|---|---|
| 2012/0154430 A1 | 6/2012 | Matsushima et al. | |
| 2012/0176195 A1 | 7/2012 | Dawson et al. | |
| 2012/0194271 A1 | 8/2012 | Yamamoto et al. | |
| 2012/0200355 A1 | 8/2012 | Braithwaite | |
| 2012/0219048 A1 | 8/2012 | Camuffo et al. | |
| 2012/0286865 A1 | 11/2012 | Chandrasekaran | |
| 2012/0286985 A1 | 11/2012 | Chandrasekaran et al. | |
| 2012/0293252 A1 | 11/2012 | Sorrells et al. | |
| 2012/0295558 A1 | 11/2012 | Wang et al. | |
| 2013/0033317 A1 | 2/2013 | Hawkes | |
| 2013/0034188 A1 | 2/2013 | Rashev et al. | |
| 2013/0044791 A1 | 2/2013 | Rimini et al. | |
| 2013/0064325 A1 | 3/2013 | Kilambi et al. | |
| 2013/0094610 A1* | 4/2013 | Ghannouchi | H03F 1/3247 375/296 |
| 2013/0094612 A1 | 4/2013 | Kim et al. | |
| 2013/0163512 A1* | 6/2013 | Rexberg | H04B 1/0475 370/328 |
| 2013/0243121 A1 | 9/2013 | Bai | |
| 2013/0251065 A1 | 9/2013 | Bai | |
| 2013/0259159 A1 | 10/2013 | McCallister et al. | |
| 2013/0329833 A1 | 12/2013 | Bai | |
| 2014/0009225 A1 | 1/2014 | Laporte | |
| 2014/0016725 A1 | 1/2014 | Peroulas et al. | |
| 2014/0038659 A1 | 2/2014 | Wei et al. | |
| 2014/0139286 A1 | 5/2014 | Laporte | |
| 2014/0161159 A1 | 6/2014 | Black et al. | |
| 2014/0161207 A1 | 6/2014 | Teterwak | |
| 2014/0177695 A1 | 6/2014 | Cha et al. | |
| 2014/0187182 A1 | 7/2014 | Yan et al. | |
| 2014/0254716 A1 | 9/2014 | Zhou et al. | |
| 2014/0274105 A1 | 9/2014 | Wang | |
| 2014/0292579 A1 | 10/2014 | Oh et al. | |
| 2014/0347126 A1 | 11/2014 | Laporte et al. | |
| 2015/0043313 A1 | 2/2015 | Stranczl et al. | |
| 2015/0043323 A1 | 2/2015 | Choi et al. | |
| 2015/0043678 A1 | 2/2015 | Hammi | |
| 2015/0049841 A1 | 2/2015 | Laporte et al. | |
| 2015/0061761 A1 | 3/2015 | Wills et al. | |
| 2015/0103952 A1 | 4/2015 | Wang et al. | |
| 2015/0123735 A1 | 5/2015 | Wimpenny | |
| 2015/0124907 A1 | 5/2015 | Li et al. | |
| 2015/0171768 A1 | 6/2015 | Perreault | |
| 2015/0325913 A1 | 11/2015 | Vagman | |
| 2015/0326349 A1 | 11/2015 | Yang et al. | |
| 2015/0333781 A1 | 11/2015 | Alon et al. | |
| 2015/0357975 A1 | 12/2015 | Avniel et al. | |
| 2015/0358039 A1 | 12/2015 | Xiong et al. | |
| 2015/0381216 A1 | 12/2015 | Shor et al. | |
| 2015/0381220 A1 | 12/2015 | Gal et al. | |
| 2016/0013820 A1 | 1/2016 | Yamanouchi | |
| 2016/0028433 A1 | 1/2016 | Ding et al. | |
| 2016/0043753 A1 | 2/2016 | Jungnickel et al. | |
| 2016/0065147 A1 | 3/2016 | Pratt et al. | |
| 2016/0087604 A1 | 3/2016 | Kim et al. | |
| 2016/0094253 A1 | 3/2016 | Weber et al. | |
| 2016/0095110 A1 | 3/2016 | Li et al. | |
| 2016/0100180 A1 | 4/2016 | Oh | |
| 2016/0112222 A1 | 4/2016 | Pashay-Kojouri et al. | |
| 2016/0174118 A1 | 6/2016 | Duan et al. | |
| 2016/0191020 A1 | 6/2016 | Velazquez | |
| 2016/0211577 A1 | 7/2016 | Miller et al. | |
| 2016/0241277 A1 | 8/2016 | Rexberg et al. | |
| 2016/0249300 A1 | 8/2016 | Tsai et al. | |
| 2016/0285485 A1 | 9/2016 | Fehri et al. | |
| 2016/0308577 A1 | 10/2016 | Molina et al. | |
| 2016/0336906 A1 | 11/2016 | Lee et al. | |
| 2016/0373072 A1 | 12/2016 | Magesacher et al. | |
| 2017/0005627 A1 | 1/2017 | Zhao et al. | |
| 2017/0033969 A1 | 2/2017 | Yang et al. | |
| 2017/0041124 A1 | 2/2017 | Khandani | |
| 2017/0047899 A1 | 2/2017 | Abdelrahman et al. | |
| 2017/0077981 A1 | 3/2017 | Tobisu et al. | |
| 2017/0176507 A1 | 6/2017 | O'Keeffe et al. | |
| 2017/0214438 A1 | 7/2017 | Ghannouchi et al. | |
| 2017/0237455 A1 | 8/2017 | Ye et al. | |
| 2017/0244582 A1 | 8/2017 | Gal et al. | |
| 2017/0302233 A1 | 10/2017 | Huang | |
| 2017/0338841 A1 | 11/2017 | Pratt | |
| 2018/0097530 A1 | 4/2018 | Yang et al. | |
| 2018/0159568 A1 | 6/2018 | Matsuura et al. | |
| 2018/0167092 A1 | 6/2018 | Hausmair et al. | |
| 2018/0287569 A1 | 10/2018 | Xu et al. | |
| 2018/0337700 A1 | 11/2018 | Huang et al. | |
| 2019/0007075 A1 | 1/2019 | Kim et al. | |
| 2019/0097662 A1 | 3/2019 | Hornbuckle et al. | |
| 2019/0104000 A1 | 4/2019 | Xie et al. | |
| 2019/0238204 A1 | 8/2019 | Kim et al. | |
| 2019/0260401 A1 | 8/2019 | Megretski et al. | |
| 2019/0260402 A1 | 8/2019 | Chuang et al. | |
| 2019/0348956 A1 | 11/2019 | Megretski et al. | |
| 2019/0363676 A1 | 11/2019 | Megretski et al. | |
| 2019/0363742 A1 | 11/2019 | Megretski et al. | |
| 2020/0028476 A1 | 1/2020 | Kim et al. | |
| 2020/0067543 A1 | 2/2020 | Kim et al. | |
| 2020/0119755 A1 | 4/2020 | Mahmood et al. | |

FOREIGN PATENT DOCUMENTS

| | | |
|---|---|---|
| CN | 104796170 A | 7/2015 |
| CN | 104871433 A | 8/2015 |
| CN | 105634539 A | 6/2016 |
| CN | 106464280 A | 2/2017 |
| EP | 0916967 A2 | 5/1999 |
| EP | 1560329 A1 | 8/2005 |
| EP | 1732208 A1 | 12/2006 |
| EP | 2991221 A1 | 3/2016 |
| JP | 2005-065211 A | 3/2005 |
| JP | 2010-136123 A | 6/2010 |
| JP | 2013-542696 A | 11/2013 |
| JP | 2014-533017 A | 12/2014 |
| KR | 20100040497 A | 4/2010 |
| WO | 20120154430 A1 | 11/2012 |
| WO | 2015107392 A1 | 7/2015 |
| WO | 2018156932 A1 | 8/2018 |
| WO | 2018227093 A1 | 12/2018 |
| WO | 2018227111 A1 | 12/2018 |
| WO | 2019/014422 A1 | 1/2019 |
| WO | 2019031714 A1 | 2/2019 |
| WO | 2019070573 A1 | 4/2019 |
| WO | 2019094713 A1 | 5/2019 |
| WO | 2019094720 A1 | 5/2019 |

OTHER PUBLICATIONS

Aguirre, et al., "On the Interpretation and Practice of Dynamical Differences Between Hammerstein and Wiener Models", IEEE Proceedings on Control TheoryAppl; vol. 152, No. 4, Jul. 2005, pp. 349-356.

Barradas, et al. "Polynomials and LUTs in PA Behavioral Modeling: A Fair Theoretical Comparison", IEEE Transactions on Microwave Theory and Techniques; vol. 62, No. 12, Dec. 2014, pp. 3274-3285.

Bosch et al. "Measurement and Simulation of Memory Effects in Predistortion Linearizers," IEEE Transactions on Mircrowave Theory and Techniques; vol. 37.No. 12; Dec. 1989, pp. 1885-1890.

Braithwaite, et al. "Closed-Loop Digital Predistortion (DPD) Using an Observation Path with Limited Bandwidth" IEEE Transactions on Microwave Theory and Techniques; vol. 63, No. 2; Feb. 2015, pp. 726-736.

Cavers, "Amplifier Linearization Using a Digital Predistorter with Fast Adaption and Low Memory Requirements;" IEEE Transactions on Vehicular Technology; vol. 39; No. 4; Nov. 1990, pp. 374-382.

D'Andrea et al., "Nonlinear Predistortion of OFDM Signals over Frequency-Selective Fading Channels," IEEE Transactions on Communications; vol. 49; No. 5, May 2001; pp. 837-843.

Guan, et al. "Optimized Low-Complexity Implementation of Least Squares Based Model Extraction of Digital Predistortion of RF Power Amplifiers", IEEE Transactions on Microwave Theory and Techniques; vol. 60, No. 3, Mar. 2012; pp. 594-603.

(56) References Cited

OTHER PUBLICATIONS

Henrie, et al., "Cancellation of Passive Intermodulation Distortion in Microwave Networks", Proceedings of the 38.sup.th European Microwave Conference, Oct. 2008, Amsterdam, The Netherlands, pp. 1153-1156.
Hong et al., "Weighted Polynomial Digital Predistortion for Low Memory Effect Doherty Power Amplifier," IEEE Transactions on Microwave Theory and Techniques; vol. 55; No. 5, May 2007, pp. 925-931.
Kwan, et al., "Concurrent Multi-Band Envelope Modulated Power Amplifier Linearized Using Extended Phase-Aligned DPD", IEEE Transactions on Microwave Theory and Techniques; vol. 62, No. 12, Dec. 2014, pp. 3298-3308.
Lajoinie et al. Efficient Simulation of NPR for the Optimum Design of Satellite Transponders SSPAs, EEE MTT-S International; vol. 2; Jun. 1998; pp. 741-744.
Li et al. "High-Throughput Signal Component Separator for Asymmetric Multi-Level Outphasing Power Amplifiers," IEEE Journal of Solid-State Circuits; vol. 48; No. 2; Feb. 2013; pp. 369-380.
Liang, et al. "A Quadratic-Interpolated Lut-Based Digital Predistortion Techniques for Cellular Power Amplifiers", IEEE Transactions on Circuits and Systems; II: Express Briefs, vol. 61, No. 3, Mar. 2014; pp. 133-137.
Liu, et al. "Digital Predistortion for Concurrent Dual-Band Transmitters Using 2-D Modified Memory Polynomials", IEEE Transactions on Microwave Theory and Techniques, vol. 61, No. 1, Jan. 2013, pp. 281-290.
Molina, et al. "Digital Predistortion Using Lookup Tables with Linear Interpolation and Extrapolation: Direct Least Squares Coefficient Adaptation", IEEE Transactions on Microwave Theory and Techniques, vol. 65, No. 3, Mar. 2017; pp. 980-987.
Morgan, et al. "A Generalized Memory Polynomial Model for Digital Predistortion of RF Power Amplifiers," IEEE Transactions of Signal Processing; vol. 54; No. 10; Oct. 2006; pp. 3852-3860.
Muta et al., "Adaptive predistortion linearization based on orthogonal polynomial expansion for nonlinear power amplifiers in OFDM systems", Communications and Signal Processing (ICCP), International Conference on, IEEE, pp. 512-516, 2011.
Naraharisetti, et al., "2D Cubic Spline Implementation for Concurrent Dual-Band System", IEEE, 2013, pp. 1-4.
Naraharisetti, et a., "Efficient Least-Squares 2-D-Cubic Spline for Concurrent Dual-Band Systems", IEEE Transactions on Microwave Theory and Techniques, vol. 63; No. 7, Jul. 2015; pp. 2199-2210.
Panigada, et al. "A 130 mW 100 MS/s Pipelined ADC with 69 SNDR Enabled by Digital Harmonic Distortion Correction," IEEE Journal of Solid-State Circuits; vol. 44; No. 12; Dec. 2009, pp. 3314-3328.
Peng, et al. "Digital Predistortion for Power Amplifier Based on Sparse Bayesian Learning", IEEE Transactions on Circuits and Systems, II: Express Briefs; 2015, pp. 1-5.
Quindroit et al. "FPGA Implementation of Orthogonal 2D Digital Predistortion System for Concurrent Dual-Band Power Amplifiers Based on Time-Division Multiplexing", IEEE Transactions on Microwave Theory and Techniques; vol. 61; No. 12, Dec. 2013, pp. 4591-4599.
Rawat, et al. "Adaptive Digital Predistortion of Wireless Power Amplifiers/Transmitters Using Dynamic Real-Valued Focused Time-Delay Line Neural Networks", IEEE Transactions on Microwave Theory and Techniques; vol. 58, No. 1; Jan. 2010; pp. 95-104.
Safari, et al. "Spline-Based Model for Digital Predistortion of Wide-Band Signals for High Power Amplifier Linearization", IEEE; 2007, pp. 1441-1444.
Sevic, et al. "A Novel Envelope-Termination Load-Pull Method of ACPR Optimization of RF/Microwave Power Amplifiers," IEEE MTT-S International; vol. 2, Jun. 1998; pp. 723-726.
Tai, "Efficient Watt-Level Power Amplifiers in Deeply Scaled CMOS," Ph.D. Dissertation; Carnegie Mellon University; May 2011; 129 pages.
Tehran, et al. "Modeling of Long Term Memory Effects in RF Power Amplifiers with Dynamic Parameters", IEEE; 2012, pp. 1-3.
Yu et al. "A Generalized Model Based on Canonical Piecewise Linear Functions for Digital Predistortion", Proceedings of the Asia-Pacific Microwave Conference; 2016, pp. 1-4.
Yu, et al. "Band-Limited Volterra Series-Based Digital Predistortion for Wideband RF Power Amplifiers," IEEE Transactions of Microwave Theory and Techniques; vol. 60; No. 12; Dec. 2012, pp. 4198-4208.
Yu, et al."Digital Predistortion Using Adaptive Basis Functions", IEEE Transations on Circuits and Systems—I. Regular Papers; vol. 60, No. 12; Dec. 2013, pp. 3317-3327.
Zhang et al. "Linearity Performance of Outphasing Power Amplifier Systems," Design of Linear Outphasing Power Amplifiers; Google e-book; 2003; Retrieved on Jun. 13, 2014; Retrieved from Internet <URL:http:www.artechhouse.com/uploads/public/documents/chapters/Zhang-LarsonCH-2.pdf; pp. 35-85.
Zhu et al. "Digital Predistortion for Envelope-Tracking Power Amplifiers Using Decomposed Piecewise Volterra Sereis," IEEE Transactions on Microwave Theory and Techniques; vol. 56; No. 10; Oct. 2008; pp. 2237-2247.
Cidronali, A., I. Magrini, R. Fagotti, and G. Manes. "A new approach for concurrent dual-band IF digital predistortion: System design and analysis." In 2008 Workshop on Integrated Nonlinear Microwave and Millimetre-Wave Circuits, pp. 127-130. IEEE, 2008.
Henrie, Justin, Andrew Christianson, and William J. Chappell. "Cancellation of passive intermodulation distortion in microwave networks." In Microwave Conference, 2008. EuMC 2008. 38th European, pp. 1153-1156. IEEE, 2008.
Riihonen et al., "Mitigation of Loopback Self-Interference in Full-Duplex Mimo Relays" IEEE Transactions on Signal Processing, 59(12), 5983-5993, Dec. 2011.
Cheng, Sheng-Lung, Wen-Rong Wu, Chun-Hsien Peng, Chen-Jui Hsu, and Paul Liang. "Digital predistortion for concurrent dual-band transmitter using a 2D LUT based method." In 2015 IEEE 16th Annual Wireless and Microwave Technology Conference (WAMICON), pp. 1-4. IEEE, 2015.
International Search Report and Written Opinion, PCT Application No. PCT/US18/19481, dated Apr. 24, 2018 (4 pages).
Liu Youjiang et al.: Concurrent Dual-Band Digital Predistortion with a Single Feedback Loop:, IEEE Transactions on Microwave Theory and Techniques, Plenum, USA, vol. 63, No. 5, May 1, 2015 (May 1, 2015), pp. 1556-1568, XP011580127, ISSN: 0018-9480, DOI: 10.1109/TMTT.2015.2417158.

* cited by examiner

MULTIBAND DIGITAL PREDISTORTER

CROSS-REFERENCE TO RELATED APPLICATIONS

This application is the national phase under 35 USC 371 of international application no. PCT/US2018/019481, filed Feb. 23, 2018, which claims the benefit of U.S. Provisional Application No. 62/463,616, filed Feb. 25, 2017, the contents of which are incorporated herein by reference.

BACKGROUND

The present disclosure relates to digital predistortion of signals in multiple radio frequency bands.

Power amplifiers, especially those used to transmit radio frequency communications, generally have nonlinear characteristics. For example, as a power amplifier's output power approaches its maximum rated output, nonlinear distortion of the output occurs. One way of compensating for the nonlinear characteristics of power amplifiers is to 'predistort' an input signal (e.g., by adding an 'inverse distortion' to the input signal) to negate the nonlinearity of the power amplifier before providing the input signal to the power amplifier. The resulting output of the power amplifier is a linear amplification of the input signal with reduced nonlinear distortion. Digital predistorted power amplifiers are relatively inexpensive and power efficient. These properties make digital predistorted power amplifiers attractive for use in telecommunication systems where amplifiers are required to inexpensively, efficiently, and accurately reproduce the signal present at their input.

With demand for higher data rate accelerating, wireless operators often do not own contiguous spectrum to provide a high data rate. Non-contiguous bands can therefore be spaced quite far apart in the available radio frequency spectrum. For example, suppose a wireless operator owns LTE Band 2 and 17 (1930-1990, 734-746 MHz) in Region A, and LTE Band 4 and 5 (2110-2155, 869-894 MHz) in Region B. The frequency coverage in the above example has a span of ~1.5 GHz (e.g., 734 MHz-2155 MHz). Such a large frequency span may result in a high sampling rate to preform digital processing on the multiband signals used by the wireless operator.

SUMMARY

In some examples, digital predistortion processing for multiband signals is performed within a condensed frequency window, resulting in more predictable and efficient use of resources, and reducing the need to implement dedicated circuitry to process signals in their original specific bands. The example implementations described herein also reduce the sampling bandwidth (and thus the number of samples needed for DPD processing) by shifting the signals to be processed into the narrower, condensed, frequency window.

In some variations, a method for digital predistortion of multiband signals is provided. The method includes receiving a plurality of input signals respectively associated with multiple radio frequency (RF) bands, with the plurality of input signals occupying an input frequency span corresponding to a difference between a maximum frequency in a highest of the multiple RF bands and a minimum frequency in a lowest of the multiple RF bands. The method further includes frequency shifting at least one signal from the plurality of input signals to produce condensed shifted signals, each corresponding to a respective one of the plurality of input signals, occupying a condensed frequency span smaller than the input frequency span, and processing the condensed shifted signals, including applying digital predistortion to the condensed shifted signals.

Embodiments of the method may include at least some of the features described in the present disclosure, including one or more of the following features.

Processing the condensed shifted signals may further include sampling the condensed shifted signals at a sampling rate equal to or exceeding an aggregate minimum rate required for the condensed shifted signals, the sampling rate being less than an input minimum rate required for the plurality of input signals in the multiple RF bands.

Processing the condensed shifted signals may further include sampling individual signals in the condensed shifted signals according to respective ones of a plurality multirate sampling conversions determined for each of the condensed shifted signals.

Processing the condensed shifted signals, including applying digital predistortion to the condensed shifted signals, may include applying the digital predistortion to the condensed shifted signals so that resultant amplified condensed shifted signals, resulting from inputting the digital predistorted condensed shifted signals to a transmit chain comprising at least one power amplifier causing non-linearity distortions, comprise magnified copies of the plurality of input signals substantially free of non-linear distortions.

Processing the condensed shifted signals may further include frequency shifting the digitally predistorted condensed shifted signals to produce predistorted output signals respectively matching the multiple RF bands of the plurality of input signals.

The method may further include amplifying each of the predistorted output signals using a respective one of a plurality of power amplifiers configured for operation in a respective frequency band associated with the each of the predistorted output signals.

The method may further include amplifying each of the predistorted output signals using a single power amplifier configured for operation in the multiple RF bands.

The method may further include periodically adjusting digital predistortion parameters controlling operations of the digital predistortion applied to the condensed shifted signals based at least on one of, for example, the condensed shifted signals, the digitally predistorted condensed shifted signals, and/or observed copies of amplified output signals produced from amplifying and frequency shifting the digital predistorted output signals using one or more power amplifiers.

Periodically adjusting the digital predistortion parameters may include deriving the digital predistortion parameters that result in a minimization of a difference between frequency shifted amplified output signals produced from frequency shifting of the amplified output signals, and the condensed shifted signals produced from frequency shifting the at least one signal from the plurality of input signals.

At least two neighboring bands of the plurality of input signals may be non-contiguous.

In some variations, a system for digital predistortion of multiband signals is provided. The system includes at least one communication module to receive a plurality of input signals respectively associated with multiple radio frequency (RF) bands, with the plurality of input signals occupying an input frequency span corresponding to a difference between a maximum frequency in a highest of the multiple RF bands and a minimum frequency in a lowest of the multiple RF bands. The system further includes a frequency shifting circuit to frequency shift at least one signal from the plurality of input signals to produce condensed shifted signals, each corresponding to a respective one of the plurality of input signals, occupying a condensed frequency span smaller than the input frequency span, and a processor to process the condensed shifted signals, including to apply digital predistortion to the condensed shifted signals.

Embodiments of the system may include at least some of the features described in the present disclosure, including at least some of the features described above in relation to the method, as well as one or more of the following features.

The processor configured to process the condensed shifted signals may further be configured to sample the condensed shifted signals at a sampling rate equal to or exceeding an aggregate minimum rate required for the condensed shifted signals, the sampling rate being less than an input minimum rate required for the plurality of input signals in the multiple RF bands.

The processor configured to process the condensed shifted signals may further be configured to sample individual signals in the condensed shifted signals according to respective ones of a plurality multirate sampling conversions determined for each of the condensed shifted signals.

The processor configured to process the condensed shifted signals, including to apply digital predistortion to the condensed shifted signals, may further be configured to apply the digital predistortion to the condensed shifted signals so that resultant amplified condensed shifted signals, resulting from inputting the digital predistorted condensed shifted signals to a transmit chain comprising at least one power amplifier causing non-linearity distortions, comprise magnified copies of the plurality of input signals substantially free of non-linear distortions.

The processor configured to process the condensed shifted signals may further be configured to frequency shift the digitally predistorted condensed shifted signals to produce predistorted output signals respectively matching the multiple RF bands of the plurality of input signals.

The system may further include a plurality of power amplifiers to respectively amplify each of the predistorted output signals.

The system may further include a single power amplifier, configured for operation in the multiple RF bands, to amplify each of the predistorted output signals.

The processor may further be configured to periodically adjust digital predistortion parameters controlling operations of the digital predistortion applied to the condensed shifted signals based at least on one of, for example, the condensed shifted signals, the digitally predistorted condensed shifted signals, or observed copies of amplified output signals produced from amplifying and frequency shifting the digital predistorted output signals using one or more power amplifiers.

In some variations, a multiband predistorter is provided that is configured to perform one or more of the method steps provided above.

In some variations, a design structure is provided that is encoded on a non-transitory machine-readable medium, with the design structure including elements that, when processed in a computer-aided design system, generate a machine-executable representation of one or more of the system modules described above, or the multiband predistorter described above.

In some variations, an integrated circuit definition dataset that, when processed in an integrated circuit manufacturing system, configures the integrated circuit manufacturing system to manufacture one or more of the system modules described above, or the multiband predistorter described above.

In some variations, a non-transitory computer readable media is provided that is programmed with a set of computer instructions executable on a processor that, when executed, cause the operations comprising the various method steps described above.

Embodiments of the multiband predistorter, the design structure, the integrated circuit definition dataset, and the computer-readable media may include at least some of the features described in the present disclosure, including at least some of the features described above in relation to the method and the system.

Other features and advantages of the invention are apparent from the following description, and from the claims.

BRIEF DESCRIPTION OF THE DRAWINGS

These and other aspects will now be described in detail with reference to the following drawings.

Like reference symbols in the various drawings indicate like elements.

DESCRIPTION

Disclosed herein are methods, systems, devices, media, and other implementations for digital predistortion of multiband signals, including a method that includes receiving a plurality of input signals respectively associated with multiple radio frequency (RF) bands (e.g., LTE signals in various non-contiguous bands), with the plurality of input signals occupying an input frequency span corresponding to a difference between a maximum frequency in a highest of the multiple RF bands and a minimum frequency in a lowest of the multiple RF bands. The method further includes frequency shifting at least one signal from the plurality of input signals to produce condensed shifted signals (also referred to collectively as an "aggregate of shifted signals" or an "aggregate signal" or an "aggregated signal"), each corresponding to a respective one of the plurality of input signals, occupying a condensed frequency span smaller than the input frequency span, and processing the condensed shifted signals, including applying digital predistortion to the condensed shifted signals. In some embodiments, processing the condensed shifted signals may further include sampling individual signals of the condensed shifted signals according to respective ones of a plurality multirate sampling conversions determined for each of the condensed shifted signals. In some embodiments, processing the condensed shifted signals may further include frequency shifting the digital predistorted condensed shifted signals to produce predistorted output signals respectively matching the multiple RF bands of the plurality of input signals.

Also disclosed herein is a system for digital predistortion of multiband signals, which includes at least one communication module (e.g., a transceiver configured to perform RF receiving and transmitting operations) configured to receive a plurality of input signals respectively associated with multiple radio frequency (RF) bands, the plurality of input signals occupying an input frequency span corresponding to a difference between a maximum frequency in a highest of the multiple RF bands and a minimum frequency in a lowest of the multiple RF bands. The system further includes a frequency shifting circuit (e.g., frequency multiplier/modulator and/or a bandpass filter to remove harmonics) to frequency shift at least one signal from the plurality of input signals to produce condensed shifted signals, each corresponding to a respective one of the plurality of input signals, occupying a condensed frequency span smaller than the input frequency span, and a processor (e.g., a microprocessor, a digital signal processor, etc.) to process the condensed shifted signals. Also included are digital predistortion applied to the condensed shifted signals.

Figure 1:
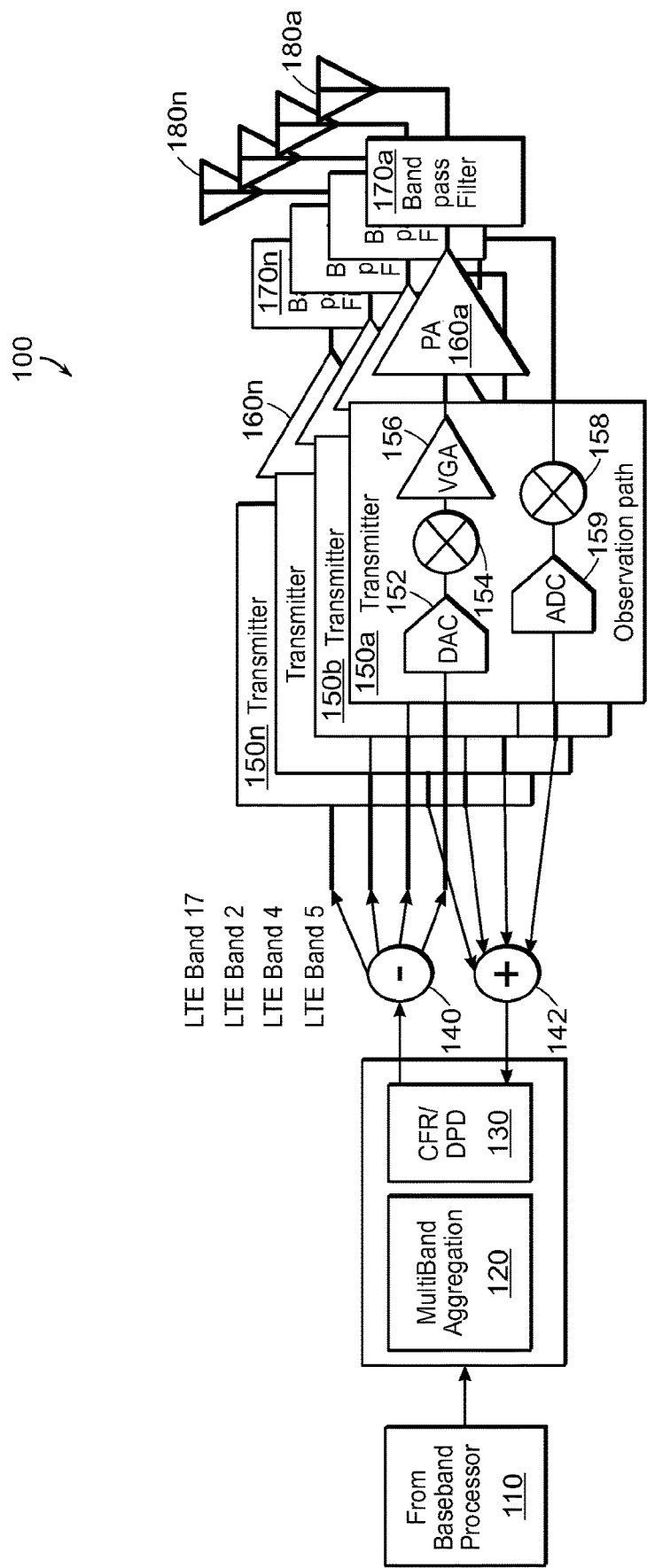
FIG. 1 is a schematic diagram of a system for digital predistortion of multiband signals.

Thus, with reference to FIG. 1, a schematic diagram of an example implementation of a system 100 for digital predistortion of multiband signals is shown. The system 100 may be housed, for example, in network nodes (e.g., base stations), or in personal mobile devices (user equipment). The system 100 includes a baseband processor 110 that, in some embodiments, is configured to generate or otherwise process signals in different RF bands (e.g., generated according to various communication protocols or technologies, including LTE or other WWAN protocols, WLAN-based protocols, short and medium range protocols such as Bluetooth, ZigBee, etc.) The baseband processor 100 may output or provide multiple baseband (BB) signals that may span multiple RF bands (e.g., in different LTE bands operated by a particular service-provider/operator of a base station in which the system 100 may be implemented). The baseband processor 110 is communicatively coupled to a multiband aggregation module 120 (also referred to as a "multiband condenser") which may be realized as a receiver, or a transceiver, coupled to a frequency shifting circuit (e.g., a frequency multiplier or modulator, which may be coupled to a bandpass filter to remove harmonics). The multiband condenser 120 may also include a sampling unit (e.g., an analog-to-digital converter, or ADC) to generate digital samples (e.g., from a resultant time-based signal corresponding to the condensed signal corresponding to one or more condensed bands) that are processed by downstream modules of the system 100. The sampling unit may be implemented as a multi-rate sampler with assigned (and optionally adjustable) sampling rates configured individually to sample each of the condensed frequency shifted signals produced by the frequency shifting circuit according to the band characteristics of the condensed bands (e.g., higher bands may be sampled at higher rates than signals at lower bands). Alternatively, a single (adjustable or non-adjustable) sampling rate may be used to sample the condensed (aggregated) time-based signal. The sampling performed on the condensed (aggregated) frequency shifted signals (e.g., to allow the predistortion processing by a processor 130) results in a reduced sampling rate than what would be required had the input multiband signals not been frequency shifted into the condensed frequency range. The multiband condenser 120 is configured to receive, e.g., from the baseband processor 110, a plurality of input signals respectively associated with multiple radio frequency (RF) bands, with the plurality of input signals occupying an input frequency span corresponding to a difference between a maximum frequency in a highest of the multiple RF bands and a minimum frequency in a lowest of the multiple RF bands, and frequency shift at least one signal from the plurality of input signals to produce condensed shifted signals.

Each of the condensed shifted signals corresponds to a respective one of the plurality of input signals. The condensed shifted signals occupy (collectively, i.e., in the aggregate) a condensed frequency span smaller than the input frequency span. At least some of the signals received by the condenser 120 may occupy non-contiguous RF bands. In some embodiments, all the signals may be shifted to produced resultant shifted signals occupying neighboring (contiguous) frequency intervals (windows) that result in the condensed frequency span. In some embodiments, only some (or just one) of the signals may be frequency shifted, with the other of the received plurality of input signals remaining at their input frequencies.

As further illustrated in FIG. 1, coupled to the multiband condenser 120 is a processor 130 configured to process the condensed shifted signals, including to apply digital predistortion to the condensed shifted signals (e.g., to apply digital predistortion processing applied to the sampled version of the time-based signal that comprises the condensed multi-bands). The processor 130 is implemented to compensate for non-linearity effects introduced by various modules/circuits of power amplification modules realized by the system 100 (as will be discussed in greater detail below). For example, the processor 130 may be configured to implement crest factor reduction (CFR) processing and/or digital predistortion (DPD) processing.

A variety of approaches may be used for CFR processing implemented by the processor 130. One approach involves upsampling and then clipping the signal, followed by filtering the clipped signal to reduce distortion, primarily in the form a ACPR. Because the filtering may itself introduce new amplitude peaks, this process may be repeated multiple times. In some such approaches, the level at which the signal is clipped may be reduced from stage to stage to progressively meet the target maximum amplitude relative to an RMS value. In another approach, the upsampled signal is clipped, and the amount by which this signal exceeds the clipping signal is filtered by a predefined filter or multiplied by a predefined time-domain window centered at a time location of the peak amplitude (i.e., so that it is appropriately band limited), and subtracted from the signal. Again, in such an approach, the process may be repeated in several stages because the filtering or windowing may introduce new peak amplitudes beyond the limit.

Yet another approach to perform CFR processing is to identify locations of peak amplitude above a threshold in the input signal, and subtract scaled versions of a predefine pulse shape. This pulse shape may be designed so that it does not add substantial energy outside the permitted signal band. Because the subtracted pulse might not remove peak amplitudes at the point the pulse is added, this process may need to be repeated multiple times. As noted, the input signal may represent a combination of signals in two or more frequency limited bands that may (or may not) be separated in frequency with intervening bands. Some approaches described herein attempt to process baseband signals representing each of the limited frequency bands with the goal of limiting the amplitude of the combined signal. The CFR processing may be realized as a software implementation (e.g., a processor-based device executing instructions that cause the processor-based device to facilitate the CFR processing), hardware (e.g., dedicated circuits, implemented on programmable arrays, application-specific integrated circuits, etc.), or a hybrid software-hardware implementation. The CFR implementation may include a peak identification circuit (e.g., to identify a peak in an aggregate time-domain signal which may have been combined from one or more time-domain representations of received signals in one or more radio transmission bands), and a pulse subtraction circuit to perform, using respective pulse shapes for one or more pulses (such pulse shaped may have been determined, locally at the system 100 or remotely at a remote device in communication with the system 100, based on optimization of a plurality of updateable parameters to control pulse shapes) individual pulse subtraction processing for the respective one or more time-domain representations. The optimization of the plurality of updateable parameters may be based on an earlier performance of iterative updating of the plurality of updateable parameters according to an iterative evaluation of a plurality of performance parameters using, at least in part, pre-determined communication system data representative of characteristics of a communication system comprising the one or more radio transmission bands. Additional details and examples of CFR processing approaches are provided in U.S. provisional application No. 62/517,348, entitled "CREST FACTOR REDUCTION," the content of which is hereby incorporated by reference in its entirety.

To further mitigate non-linear distortion caused by amplifiers included in the system 100, the processor 130 predistorts the signals (in this case, the condensed shifted signals resulting from the processing applied by the condenser 120 to the signal inputted to it) to generate intermediate input signal(s) comprising inverse nonlinear distortions (i.e., an inverse of the nonlinear distortion introduced by a transmit chain of the system 100), such that the nonlinear distortion introduced by the system 100's transmit chain (comprising, in this example, the transmitter and observation receiver circuitry 150a-n and the non-linear power amplifiers 160a-n) is substantially cancelled by the inverse nonlinear distortion. The output signal of the system 100's transmit chain (e.g., the output of one or more power amplifiers 160a-n depicted in FIG. 1) would consequently be substantially free of nonlinear distortion. As will be discussed in greater detail below with respect to FIG. 3, the nonlinear input/output characteristic of the transmit chain of the system 100 may change over time. Therefore, an adaptation module (more particularly described in FIG. 3) periodically updates a set of DPD parameters, used by a DPD processing implementation realized by the processor 130, to generate the intermediate input signals provided to the transmit chain of the system 100 to reflect the changes in the nonlinear input/output characteristics of the transmit chain.

With continued reference to FIG. 1, the system 100 further comprises the transmit chain used to perform the transmission processing on the predistorted condensed frequency shifted signals produced by the processor 130. Particularly, in the embodiments of FIG. 1, the transmit chain includes transmitter and observation path circuitry 150a-n, which may include individual circuitry modules (150a, 150b, and 150n) associated with respective ones of the output signals of the processor 130 (i.e., the predistorted condensed frequency shifted signals), and individual power amplifiers to amplify each of the resulting predistorted signals. The signals produced by the processor 130 may be provided to the individual circuitry modules 150a-n via a demultiplexer 140. A demultiplexer channelizes the predistorted signal into multiple bands before passing the data to digital-to-analog converters in transmitters. Channelization may be realized by a frequency multiplier followed by a filter. Processing rate is relatively low compared to the actual RF frequency span. Because the processor 130 may be configured to produce signals in a condensed, pre-established frequency range (corresponding to the condensed frequency span), thus avoiding the need to re-configure any of the applied processing operation to different frequency ranges that depend on the original input signals, the transmitter and observation path circuitries can also be configured to operate in set, pre-established, frequency ranges without needing to adjust the circuitries. Each transmitter circuitry of the circuitries 150a-n generally includes a digital-to-analog converter (e.g., DAC 152 of the circuitry 150a), coupled to a frequency modulator/multiplier (e.g., frequency modulator 154 of the circuity 150), coupled to a variable gain amplifier (e.g., VGA 156 of the circuitry 150a). The output signal of each transmitter circuitry is thus an analog predistorted signal that has been shifted back to the original frequency band corresponding to the input signal that was provided to the multiband aggregation/condenser 120. That predistorted analog signal (also referred to as predistorted output signal) from each of the circuitries 150a-n is then provided to a respective one of a plurality of power amplifiers (e.g., PA 160a-n), that are each configured for operation with signals in the respective frequency band (i.e., the PA 160a is configured for operation with signals in the band corresponding the signal produced by the transmitter circuity of the circuitry 150a) to produce amplified output signals that are then transmitted (e.g., after being filtered by a respective bandpass filter from a plurality of bandpass filters 170a-n to remove any unwanted harmonics or other signal noise) via antennas 180a-n.

As also shown in FIG. 1, each of the circuitries 150a-n includes an observation path circuitry to measure the amplified output signals produced by the PA's 180a-n in order to perform the DPD adaptation process (discussed in greater detail below). Each observation path circuitry includes a frequency demodulator/multiplier (e.g., frequency demodulator 158) whose output is coupled to an analog-to-digital converter (e.g., ADC 159) to produce the digital samples used in the DPD adaptation process. Signals produced by the observation path circuitries (e.g., to implement a DPD adaptation process) are provided to the processor 130 via, for example, a multiplexer 142. The condensed spectrum from multiple observation path data can also be reconstructed inside the processor 130.

Figure 2:
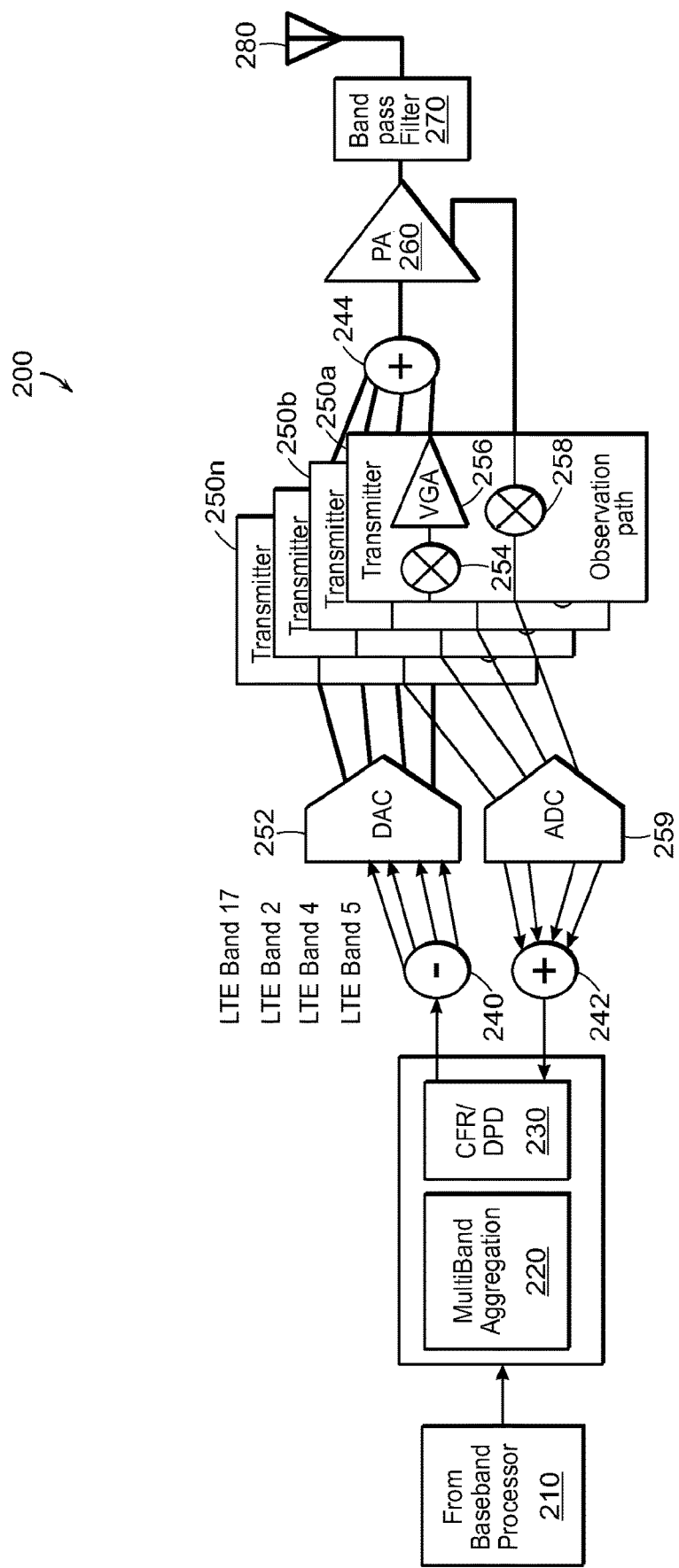
FIG. 2 is a schematic diagram of another example system for digital predistortion of multiband signals.

With reference now to FIG. 2, a schematic diagram of another example system implementation 200 for digital predistortion of multiband signals is shown. The system implementation 200 is similar to the example system implementation 100 depicted in FIG. 1, except that instead of using multiple power amplifiers, such as the PA's 180a-n and multiple ADC or DCA (such as those used in conjunction with the transmitter and observation path circuitries 150a-n), only one digital-to-analog converter 252, one analog-to-digital converter 259, and one power amplifier 270 are used. The DAC 252 and ADC 259 may both be configurable converters with controllably adjustable sampling rates to implement, for example, multi-rate sampling that may be realized for the transmitter circuits 150a-n of FIG. 1. The use of a single DAC and a single ADC results in reduced space/housing requirements for the circuitries implementation, but may cause an increase in the complexity of the control operations required to adjustably control the sampling rates required for different signals processed by the converters. The use of a single PA (instead of the use of dedicated multiple PA's that can be more optimally configured for each of the predistorted frequency shifted signals outputted by multiple transmitter and observation path circuitries 250a-n) can likewise reduce the footprint of the circuit (in terms of space/housing requirements), but may result in a less optimal operation of the PA (e.g., because it will need to handle a larger bandwidth of signals, which may result in increased noise and distortions). The frequency shifted outputs from 250a-n are summed and applied to the input of PA 260.

Figure 3:
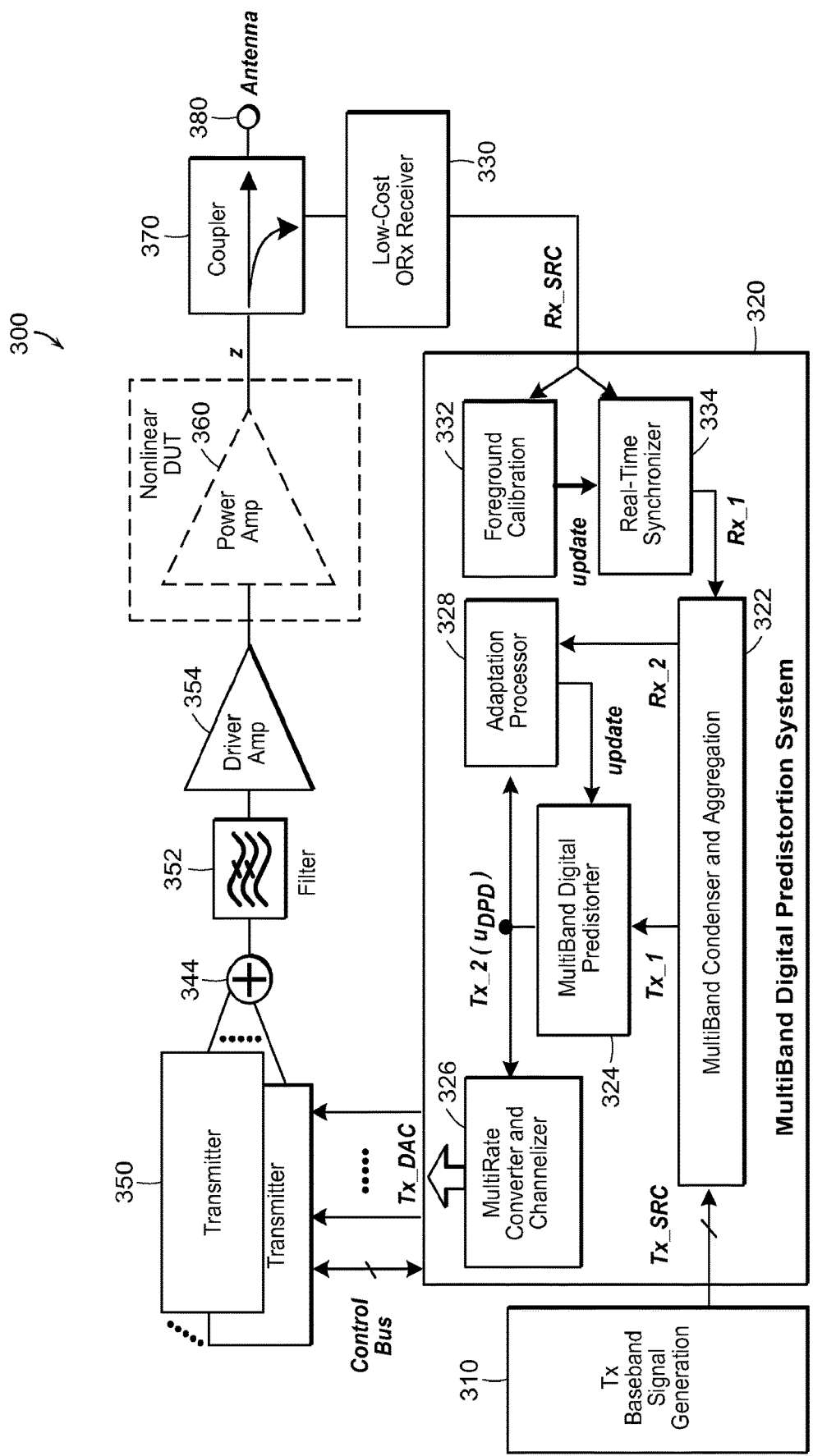
FIG. 3 is a diagram of a further example system for digital predistortion of multiband signals.

Turning next to FIG. 3, a diagram of an example system implementation 300 for digital predistortion of multiband signals, providing more detailed view of the configuration of at least some of the various circuits and units of, for example, the system implementations 100 and 200 of FIG. 1 or 2, is shown. The system 300 includes a Tx baseband signal generation module 310, which is configured to generate or otherwise provide multiband signals (e.g., multiple signals to be transmitted via multi LTE bands or other communication protocols' bands including CPRI interface), to a multiband digital signal predistortion system 320. The multiband signals corresponding to Tx_SRC include at least some signals that are in non-contiguous bands relative to others of the signals. The multiband digital signal predistortion system 320 includes a multiband aggregator (or condenser) 322, which may be implemented similarly to the multiband condenser 120 or 220 of FIGS. 1 and 2, and may be realized as a receiver (or transceiver), coupled to a frequency shifting circuit (e.g., a frequency multiplier or modulator, which may be coupled to a bandpass filter to remove harmonics). Each of the condensed shifted signals corresponds to a respective one of the plurality of input signals.

The multiband condenser 322 may also include a sampling unit (e.g., an analog-to-digital converter, or ADC) to generate digital samples (represented as output signal Tx_1 in FIG. 3) that are processed by downstream modules (e.g., the multiband digital predistorter 324 or a CFR unit (not shown in FIG. 3) of the predistortion system 320). The sampling unit may be implemented as a single-rate or multi-rate sampler with assigned (and optionally adjustable) sampling rates. In embodiments in which multi-sampling rates are used for different bands of the time-based signal, the sampler may be configured to individually sample each of the condensed frequency shifted signals produced by the frequency shifting circuit, according to the band characteristics of the condensed bands (e.g., higher bands may be sampled at higher rates than signals at lower bands). As noted, the sampling operations (whether through a single rate sampler or a multi-rate sampler) performed on the condensed (aggregated) frequency shifted signals result in a reduced sampling rate than would otherwise be required, had the input multiband signals not been frequency shifted into the condensed frequency range.

As discussed with respect to the processor 130 of FIG. 1, the multiband digital predistorted 324 is configured to predistort the signals (in this case, the condensed shifted signals Tx_1 resulting from the processing applied by the condenser 322 to the signals Tx_SRC inputted to it) to generate intermediate input signal(s) comprising inverse nonlinear distortions, such that the nonlinear distortion introduced by the system 300's transmit chain (comprising, for example, digital-to-analog converters, frequency modulator, and the power amplifier(s)) is substantially cancelled by the inverse nonlinear distortion. As noted, because the nonlinear input/output characteristics and behavior of the transmit chain changes over time, an adaptation processor 328 periodically updates a set of DPD parameters, used by the digital predistorter 324, to reflect the changes in the nonlinear input/output characteristic of the transmit chain.

Figure 4:
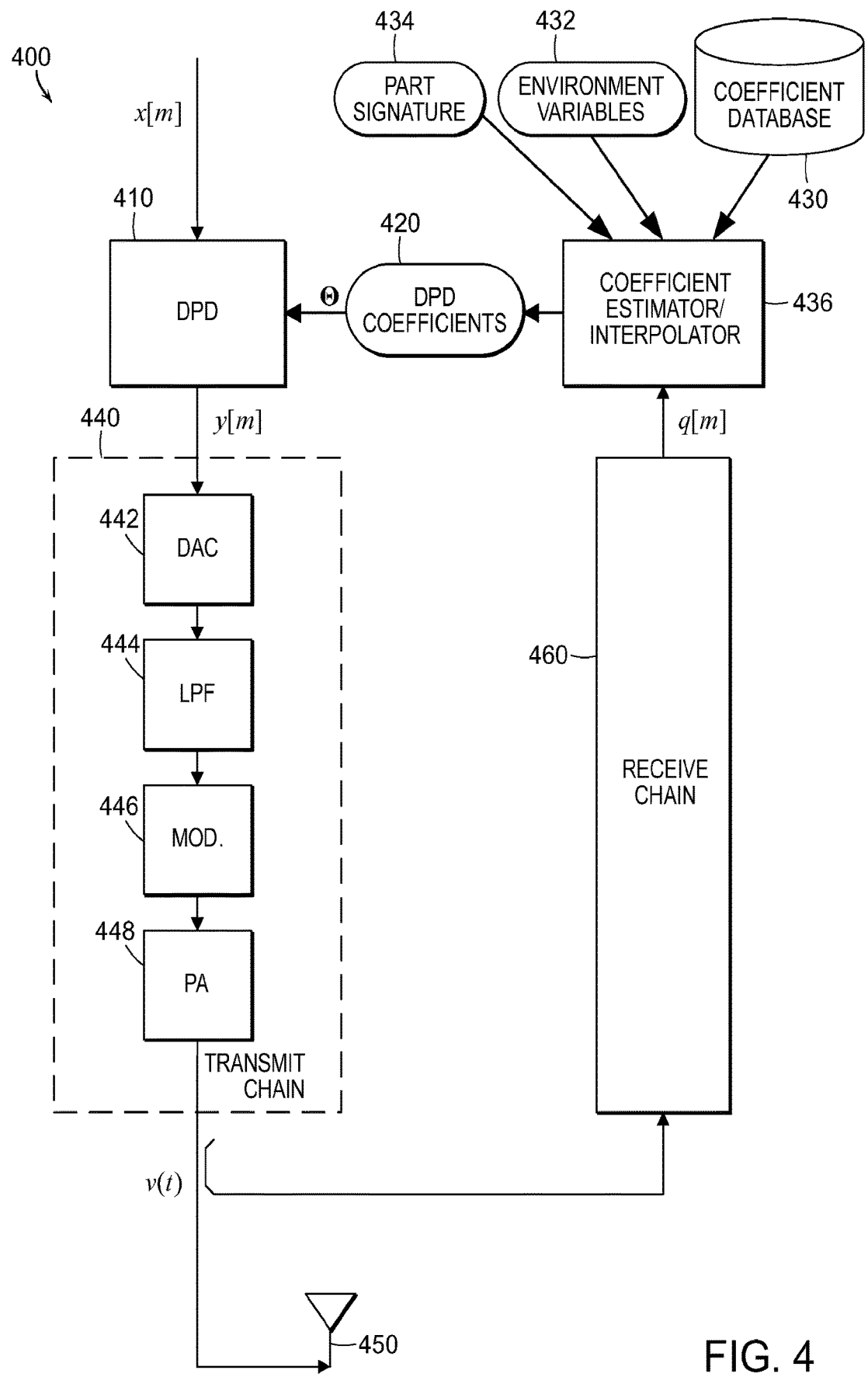
FIG. 4 is a block diagram of an adjustable pre-distorting power amplifier system that may be used as part of the implementations of the systems of FIGS. 1, 2, and 3.

More particularly, an example of an implementation to update parameters is provided with reference to FIG. 4, that includes a block diagram of an adjustable pre-distorting power amplifier system 400, which may be similar to, or include, the portion of the system 300 comprising the digital predistorter 324, the transmit chain (comprising, for example, a DAC, frequency modulator(s), and/or the power amplifier(s)), and the adaptation module 328. In the example system 400, a digital input signal x[m] at a baseband or intermediate frequency is passed through a Digital Pre-Distorter (DPD) 410 (which may be similar, in implementation or functionality, to the multiband digital predistorter 324 of FIG. 3) to produce a "pre-distorted" input y[in], which is passed through a transmit chain 440 to produce a driving signal v(t) that drives an antenna 450. The transmit chain may include a Digital-to-Analog Converter (DAC) 442, an analog lowpass filter (LPF) 444, and a modulator 446 (e.g., multiplication by a local oscillator) to operate on the output of the LPF 444. The output of the modulator is passed to a power amplifier (PA) 448. The PA 448, as well as other elements in the transmit chain, may introduce non-linearities, which may be manifested in the driving signal v(t) as harmonic and/or intermodulation distortions of the input signal x[m]. As noted, to overcome or mitigate these non-linearities, the DPD 410 introduces non-linearities that are intended to "pre-invert" (i.e. pre-distort) the non-linear effects of the transmit chain. In some examples, the DPD performs the transformation of the desired signal x[m] to the input y[m] of the transmit chain by using delay elements (not shown) to form a set of delayed versions of the desired signal, and then using a non-linear polynomial function of those delayed inputs. In some examples, the non-linear function is a Volterra series:

$$y[n]=h_0\Sigma_p\Sigma_{\tau_1,\ldots,\tau_p}h_p(\tau_1,\ldots\tau_p)\Pi_{j=1\ldots p}x[n-\tau_j]$$

In some examples, the non-linear function is a reduced set of Volterra terms, for example a delay polynomial:

$$y[n]=h_0+\Sigma_p\Sigma_\tau h_p(\tau)x[n-\tau]|x[n-\tau|^{(P-1)}$$

In some embodiments, to invert the non-linear effects of the transmit chain, a relatively large number of terms of such a series representation may be needed, and the coefficients of those terms (e.g., $h_p$ terms) need to be accurately set. The coefficients in such approaches may be continually updated to maintain good linearization. Approaches to such continual updating may include, for example, incremental updates using y[m] (the output of DPD 410), and/or observation of v(t) and other system characteristics.

With continued reference to FIG. 4, the DPD 410 may be controlled using a controller to determine/compute DPD coefficients (shown as DPD coefficients Θ 420) to adjust the DPD 410 using such determined DPD coefficients. In some embodiments, the DPD coefficients Θ 420 are determined using a database of coefficients 430, and values that essentially characterize the operation "regime" (i.e., a class of physical conditions) of the transmit chain, and/or of other system components (including remote load components and load conditions). These values (e.g., quantitative or categorical digital variables) include environment variables 432

(e.g., temperature, transmitter power level, supply voltage, frequency band, load characteristics, etc.) and/or a part "signature" 434, which represents substantially invariant characteristics, and which may be unique to the electronic parts of the transmit chain 440.

Determined system characteristic values or attributes may be provided to a coefficient estimator/interpolator 436 (e.g., via a feedback receive chain 460). The determined characteristics and metrics may be used to estimate/derive appropriate DPD coefficients. For example, the DPD coefficient sets may be computed so as to achieve some desired associated distortion measures/metrics that characterize the effects of the preprocessing, including an error vector magnitude (EVM), an adjacent channel power ratio (ACPR), or other types of distortion measures/metrics.

The coefficient interpolator 436 uses the various inputs it receives to access the coefficient database 432 and determine and output the corresponding DPD coefficients 420. A variety of approaches may be implemented by the coefficient estimator/interpolator 436, including selection and/or interpolation of coefficient values in the database according to the inputs, and/or applying a mathematical mapping of the input represented by values in the coefficient database. For example, the estimator/interpolator 436 may be configured to select, from a plurality of sets of DPD coefficients (in the database 430), a DPD coefficient set associated with one or more pre-determined system characteristics or some metric derived therefrom. The DPD coefficients used to control/adjust the DPD 410 may be determined by selecting two or more sets of DPD coefficients from a plurality of sets of DPD coefficients (maintained in the database 430) based on the system characteristics. An interpolated set of DPD coefficients may then be determined from the selected two or more sets of DPD coefficients. Further details regarding the determination of DPD coefficients (e.g., using a DPD coefficient database) are provided in U.S. Pat. No. 9,590,668, entitled "Digital Compensator," the content of which is hereby incorporated by reference in its entirety.

Another example of a technique for updating the DPD parameters/coefficients (which may be denoted as 'a') can be found in U.S. Provisional Patent Application No. 62/517,380, titled "LINEARIZATION SYSTEM," which is incorporated herein by reference in its entirety. Briefly, to update the parameters, a, used by, for example, the adaptation processor 328 of FIG. 3, a predictor module (which may be implemented using the adaptation processor 328) processes the intermediate input signal to the transmit chain, i.e., the signal Tx_2 (alternatively denoted as $u_{DPD}$) shown in FIG. 3), and a sensed version (e.g., a signal b) of the output signal z of the transmit chain (or some other output module that is downstream of the transmit chain) to generate an updated set of parameters, a'. The sensed signal b is observed via an observation receiver 330 (e.g., a low-cost (for example, a low sampling rate) observation receiver) coupled to the output of a power amplifier (or multiple power amplifiers, as in the example embodiments of FIG. 1). The resultant observed signal, Rx_SRC (used for the DPD adaptation processes), is provided to a real-time synchronizer 334 (configured to synchronize or correlate the signals used for the adaptation processes) and to a foreground calibration unit 332 that is configured to update calibration parameters (such as delay and phase differences between the observed output signal and the input signals), used by the real-time synchronizer 334. The resultant synchronized signal Rx_1, which is an observed and synchronized version of the multiband output signals of the power amplifier(s) 360, is provided to the multiband condenser (multiband aggregation unit) 322 where it is frequency shifted into a condensed frequency span (substantially matching the frequency window used to condense the actual input signal(s) Tx_SRC) and sampled (optionally using multi-rate sampling or single-rate sampling).

In one example, the predictor module determines an updated set of parameters a' that, in combination with the basis functions and the intermediate input signal, $u_{DPD}$ (Tx_2), generate a predicted signal that is as close as possible to the sensed signal, b (e.g., in a least mean squared error sense). This can be restated as:

$$P(y) = \sum_{i=1}^{n} \alpha_i f_i(y)$$

The predictor, P, may be provided to the DPD adaptation processor 328 which processes the predictor P to update the parameters of coefficients of the multiband digital predistorter 324. In some examples, for the predictor P described above, the adaptation processor 328 configures the digital predistorter 324 to perform according to an approximate inverse of the predictor P as follows:

$$DPD(u) = P^{-1}(u) \approx 2x - \sum_{i=1}^{n} \alpha_i f_i(u)$$

Alternatively, the DPD parameters may be set as: $a_i = -\alpha_i$. In the above equation, the operand u corresponds to the input signals to the multiband digital predistorter 324 (namely, the condensed shifted signals Tx_1 outputted by the condenser 322).

In another example, the predictor module may be configured to determine an updated set of parameters $\hat{\alpha}$ that, in combination with the basis functions and the sensed signal, b, generate a predicted signal, $\hat{u}_{DPD}$ (corresponding, in the example embodiments of FIG. 3, to predicted predistorted condensed frequency shifted signals corresponding to Tx_2) that is as close as possible (e.g., in a least mean squared error sense) to the intermediate predistorted signal, $u_{DPD}$ (corresponding to the signal Tx_2) This can be restated as:

$$P(b) = \sum_{i=1}^{n} \alpha_i f_i(b)$$

That is, in such embodiments, P is an estimate of a (post) inverse of the nonlinearity of the transmit chain. The predictor P is provided to the DPD adaptation processor 328 which processes the predictor, P to update the coefficients/parameters of the multiband digital predistorter 324. In some examples, the adaptation processor 328 configures the multiband digital predistorter 324 according to the predictor P as follows:

$$DPD(u) = P(b) = \sum_{i=1}^{n} \alpha_i f_i(b)$$

or essentially $a_i = \alpha_i$.

Instead of deriving updated parameters, a', that cause the sense value, b, to be as close as possible to the intermediate signal $u_{DPD}$ (Tx_2), in another example, updating of the DPD parameters/coefficients (used by the multiband digital predistorter 324) may be implemented to generate an updated set of parameters, a', that, in combination with the basis functions, represent a difference between the model of the nonlinear input/output characteristic of the transmit chain currently being used by the multiband digital predistorter 324 and the current nonlinear input/output characteristic of the transmit chain. In one example, the predictor module determines parameters α that, in combination with the basis functions and the input signal to the DPD (rather than using the intermediate signal $u_{DPD}$ (or Tx_2)) generate a predicted signal, $\hat{b}$ that is as close as possible to the sensed signal, b (e.g., in a least mean squared error sense), which can be restated as:

$$P(u) = \sum_{i=1}^{n} \alpha_i f_i(u).$$

The parameters, α in combination with the basis functions represent the difference between the model of the nonlinear input/output characteristics of the transmit chain, and the actual nonlinear input/output characteristic of the transmit chain because the effects both the DPD and the transmit chain on the input signal are represented in the sensed signal, b. An output of the predictor module, i.e., P, is provided to a DPD update module which processes the predictor P to update the digital predistorter 324. In some examples, for the predictor P the DPD update module configures the multiband DPD 324 to combine an approximate inverse of the predictor with the existing DPD according to $a'_i \leftarrow a_i + \alpha_i$. This essentially approximates a cascade of the approximate inverse of the predictor, $P^{-1}$, with the previous DPD configuration to yield the new DPD configuration.

In another example, the predictor module determines a set of parameters α that, in combination with the basis functions and the sensed signal, b generate a predicted signal, $\hat{u}$ that is as close as possible to the input signal, u (e.g., in a least mean squared error sense), which can be restated as:

$$P(b) = \sum_{i=1}^{n} \alpha_i f_i(b).$$

It is to be noted that the various adaptation approaches described herein allow DPD adaptation for the condensed multiband signals, thus requiring fewer samples (and, in some implementations, significantly fewer samples) than would be required if the signals were not shifted into a more condensed frequency window.

Turning back to FIG. 3, having produced the predistorted condensed frequency shifted signals ($u_{DPD}$ or Tx_2), the signal is provided to both the adaptation processor 328 (as part of a periodical adaptation process), and to a multi-rate converter and channelizer 326 (e.g., a multi-rate digital-to-analog converter) to convert the predistorted digital samples into output analog signals (in frequency bands corresponding to the condensed frequency window). The converter and channelizer 326 may be configured to first channelize the output of multiband digital predistorter 324 and then resample the individual bands according to the data rate requirements on the transmitter array. The condensed output signals (represented in FIG. 3 as the signals Tx_DAC) are provided to a plurality of transmitters 350 (e.g., multiple low-cost transmitters, which may be transmitters with lower sampling rates, with the multiple transmitters being implemented similarly or differently with respect to each other), each corresponding to one of the signal bands of the multiband signals, to produce predistorted output signals. Each of the transmitters 350 may include, for example, a frequency modulator (e.g., frequency multiplier) and/or other circuitry to convert the condensed multiband signals Tx_DAC to the frequency bands matching the frequency bands of the initial Tx_SRC signals (i.e., the signals generated, or otherwise processed, by the Tx baseband signal generator 310) provided to the multiband aggregation unit 322 (the multiband condenser). The predistorted, frequency shifted, output signals of the transmitters 350 are provided (e.g., via a multiplexer 344) to the filters 352 (e.g., bandpass filter(s) to, for example, remove harmonics resulting from the frequency shifting performed by the transmitters 350), and optionally to a driver amplifier(s) 354 (e.g., which may be a variable gain amplifier). The predistorted and frequency shifted output signals (whether or not they have been fed to the filter 352 and/or the driver amplifier 354) are fed to the power amplifier 360. As noted, ordinarily, the non-linear behavior of the power amplifier 360 would cause non-linear distortion for the signals it receives. However, because the signals provided as input to the power amplifier 360 have been predistorted, the output signals resulting from the amplification performed by the power amplifier are amplified versions of the original input signals Tx_SRC (i.e., substantially free of distortions). In some embodiments, and as described in relation to the system 100 of FIG. 1, the power amplification of the predistorted signals may be performed by a plurality of power amplifiers, with each of the plurality of power amplifiers more optimally configured for a respective one of the RF bands of the original input signals (Tx_SRC). A combination of the multi-rate converter and channelizer 326, multiple transmitters 350 (each of the transmitter 350 may be implemented similarly and differently, with at least some of the transmitters being low-sampling-rate transmitters), the filter(s) 352, the driver amplifier 354, the power amplifier 360, the coupler 370, and/or the antenna 380 may define the transmit chain of the system 300 of FIG. 3.

Figure 5:
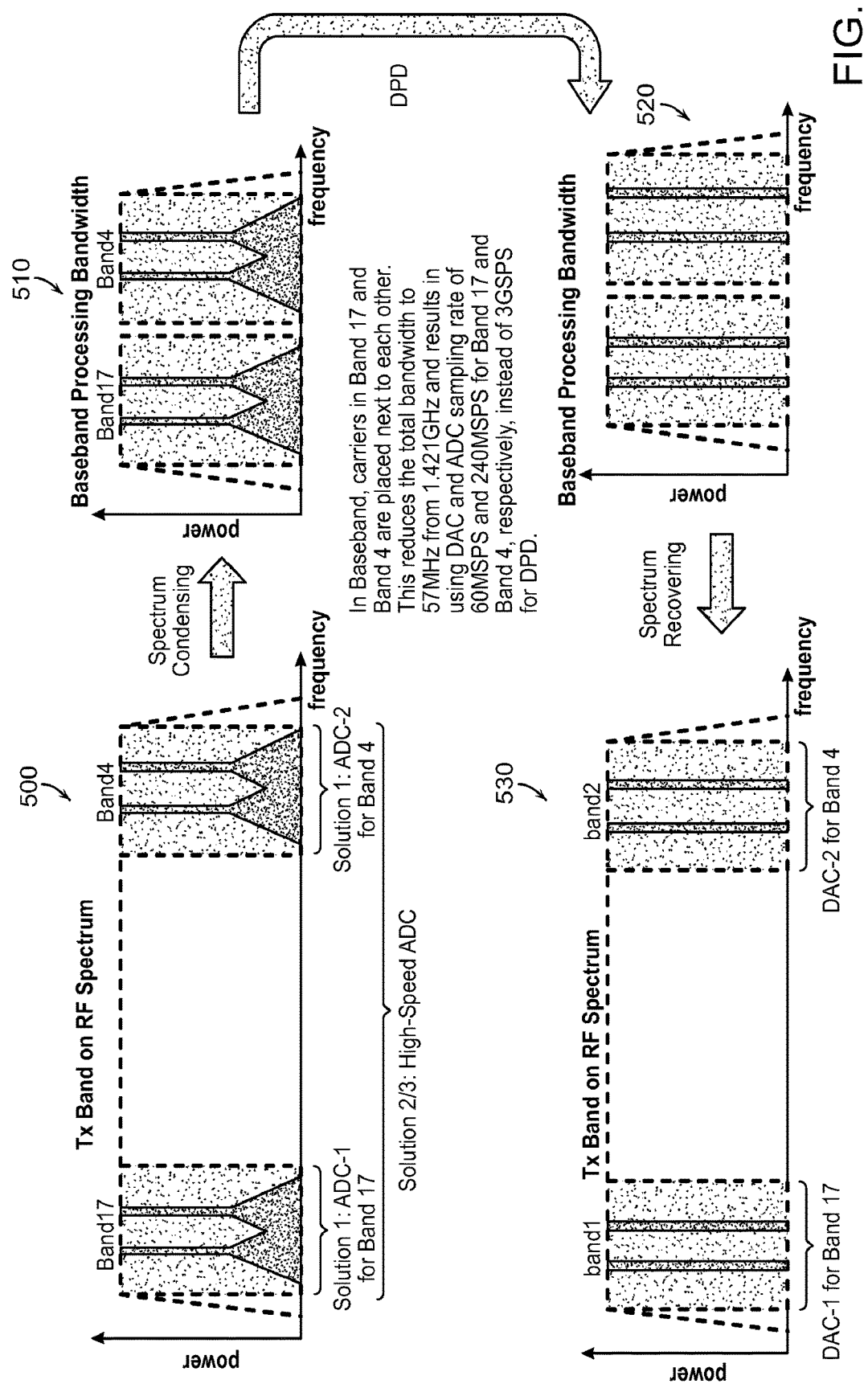
FIG. 5 includes a sequence of signal diagrams showing respective signal spectrums at sequential processing stages applied to multiband signals.

With reference next to FIG. 5, a sequence of signal diagrams 500, 510, 520, and 530, showing respective signal spectra at sequential processing stages applied to multiband signals (in this example, signals in LTE Band 17 and Band 4) is shown. In the diagram 500, input multiband signals, which are distributed in contiguous or non-contiguous bands, are provided. The input signals may have been generated by, or handled by, a baseband processor or signal generator such as the baseband processor 110 or the baseband signal generation module 310 of FIGS. 1 and 3, respectively. The diagram 510 shows the condensed frequency shifted multiband signals, after at least one of the input signals shown in the diagram 510 has been frequency shifted. The resultant spectrum has a frequency span that is smaller than the frequency span of the signals in the diagram 510. In the example of FIG. 5, to condense the spectrum of the multiband signals, the carriers in Band 17 and Band 4 are placed next to each other. This reduces the total bandwidth to 57 MHz from 1.421 GHz and results in using example DAC and ADC sampling rate of 60 MSPS and 240 MSPS for Band 17 and Band 4, respectively (such sampling rate is needed to allow, for example, DPD processing), instead of 3GSPS for non-condensed signals.

Once the signals are condensed, they are processed (e.g., converted to digital signals, and are subjected to DPD and/or CFR processing) to produce the processed (e.g., predistorted), condensed signals shown in the diagram 520. Following the processing applied to the condensed signals, the signals illustrated in the diagram 520 are frequency shifted to produce predistorted output signals (as illustrated in the diagram 530) in which the resultant output signals have frequencies substantially matching the input signals' initial RF frequencies in their original RF bands (e.g., the predistorted condensed signals shown in the diagram 520 are expanded back to bands matching the original bands of the signals illustrated in the diagram 500).

Figure 6:
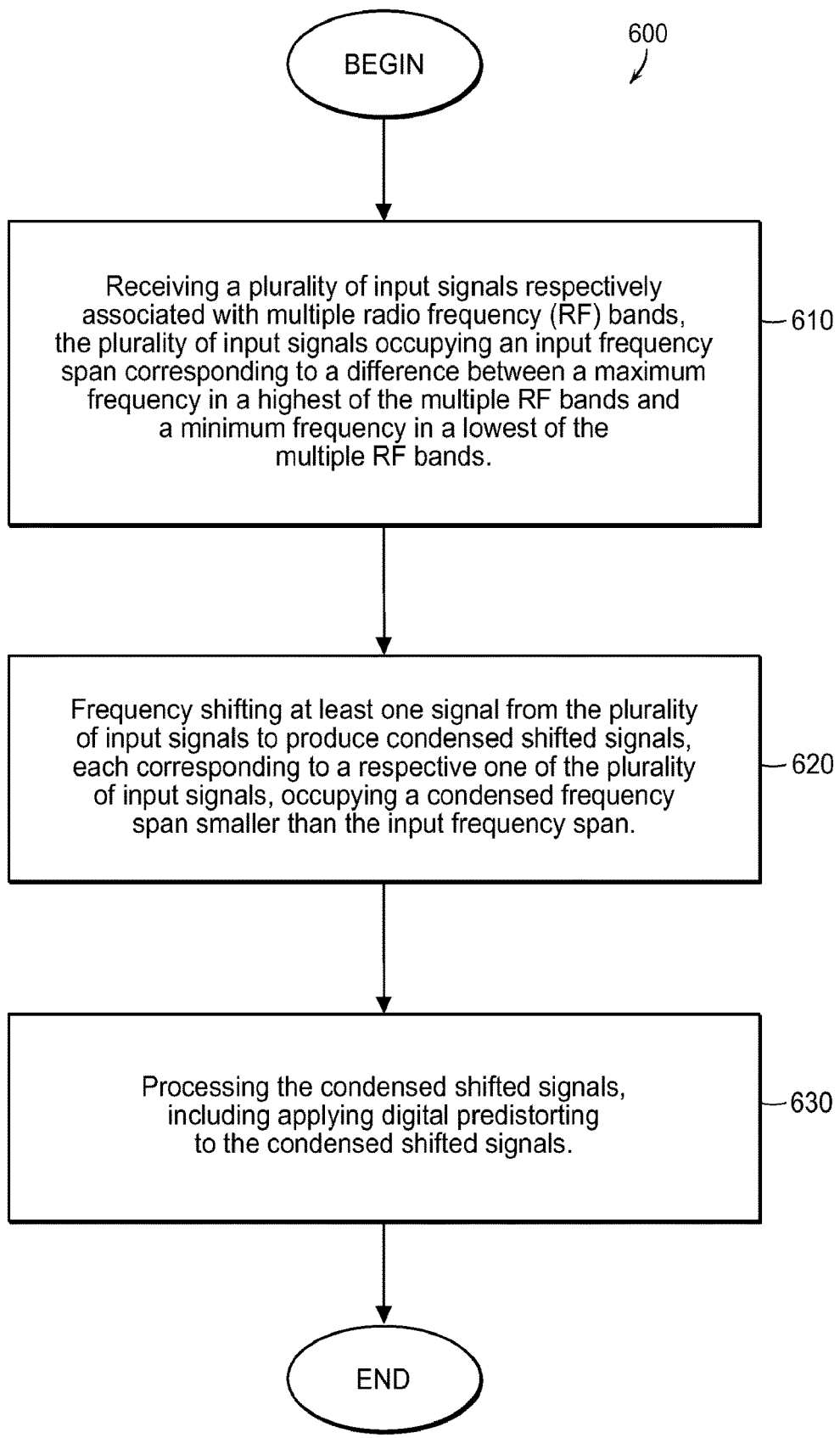
FIG. 6 is a flowchart of an example procedure for digital predistortion of multiband signals.

Turning next to FIG. 6, a flowchart of an example procedure 600 for digital predistortion of multiband signals is shown. The procedure 600 includes receiving 610 a plurality of input signals respectively associated with multiple radio frequency (RF) bands, with the plurality of input signals occupying an input frequency span corresponding to a difference between a maximum frequency in a highest of the multiple RF bands and a minimum frequency in a lowest of the multiple RF bands. As discussed herein, the multiband signals may include signals of any type of RF/wireless communication protocol, and in any combination of radio frequency bands. For example, the frequency bands on which the procedure 600 is applied may include contiguous and/or non-contiguous bands. Thus, for example, in some embodiments, at least two neighboring bands of the plurality of input signals may be in non-contiguous RF bands.

As further shown in FIG. 6, the procedure 600 further includes frequency shifting 620 (e.g., using a frequency modulator/multiplier, such as one implemented using a local oscillator) at least one signal from the plurality of input signals to produce condensed frequency shifted signals (also referred to as aggregated shifted signals), each corresponding to a respective one of the plurality of input signals, occupying a condensed frequency span smaller than the input frequency span. The condensed frequency shifted signals, now occupying a narrower (condensed) frequency window than the one occupied by the original input signals, can be converted to digital samples using a lower sampling rate than would be required for the original input signals that had occupied a broader frequency window (or span). The sampling of the condensed frequency shifted signals may be performed according to a multi-rate sampling scheme, in which signals in different bands are sampled according to different rates (e.g., a signal in high band will be processed with a higher sampling than a signal in a neighboring lower band). As noted, a single sampling rate may be applied to the frequency-shifted time-based signal.

Having condensed the input signals to produce the condensed shifted signals, the procedure 600 additionally includes processing 630 the condensed shifted signals, including applying digital predistortion to the condensed shifted signals. In some embodiments, processing the condensed shifted signals may further include sampling the condensed shifted signals at a sampling rate equal to or exceeding an aggregate minimum rate required for the condensed shifted signals, with the sampling rate being less than an input minimum rate required for the plurality of input signals in the multiple RF bands. The sampling rate at individual condensed bands may vary, e.g., according to some pre-determined rate, with rates for high bands being higher than sampling rates for signals in lower bands. Processing the condensed shifted signals, including applying digital predistortion to the condensed shifted signals, may include applying the digital predistortion to the condensed shifted signals so that resultant amplified condensed shifted signals, resulting from inputting the digitally predistorted condensed shifted signals to a transmit chain comprising at least one power amplifier causing non-linearity distortions, comprise magnified copies of the plurality of input signals substantially free of non-linear distortions. That is, the predistortion processing applied to the condensed signals aims to cause the predistorted signals, when subsequently frequency shifted to their respective original bands and provided to the power amplifier(s), to be magnified without adding non-linearities.

Processing the condensed shifted signals may further include frequency shifting the digital predistorted condensed shifted signals to produce predistorted output signals respectively matching the multiple RF bands of the plurality of input signals. That is, after predistorting digital samples of the condensed frequency shifted signals, the predistorted digital samples are converted to analog signals and are frequency shifted to their original RF bands. In some embodiments, the procedure may further include amplifying each of the predistorted output signals using a respective one of a plurality of power amplifiers configured for operation in a respective frequency band associated with the each of the predistorted output signals (i.e., each band, comprising one or more predistorted output signals, may be amplified by a separate power amplifier dedicated for that band). Alternatively, the procedure 600 may include amplifying each of the predistorted output signals using a single power amplifier configured for operation in the multiple RF bands.

As noted, the embodiments described herein may also include implementations for adaptive DPD processing (to controllably adjust DPD parameters or coefficients). In some implementations, the procedure of FIG. 6 may thus include periodically adjusting digital predistortion parameters controlling operations of the digital predistortion applied to the condensed shifted signals based at least on one of, for example, the condensed shifted signals, the digital predistorted condensed shifted signals, or observed copies of amplified output signals produced from amplifying and frequency shifting the digital predistorted output signals using one or more power amplifiers. Periodically adjusting the digital predistortion parameters may include deriving the digital predistortion parameters that result in a minimization of a difference between frequency shifted amplified output signals produced from frequency shifting of the amplified output signals, and the condensed shifted signals produced from frequency shifting the at least one signal from the plurality of input signals.

Figure 7:
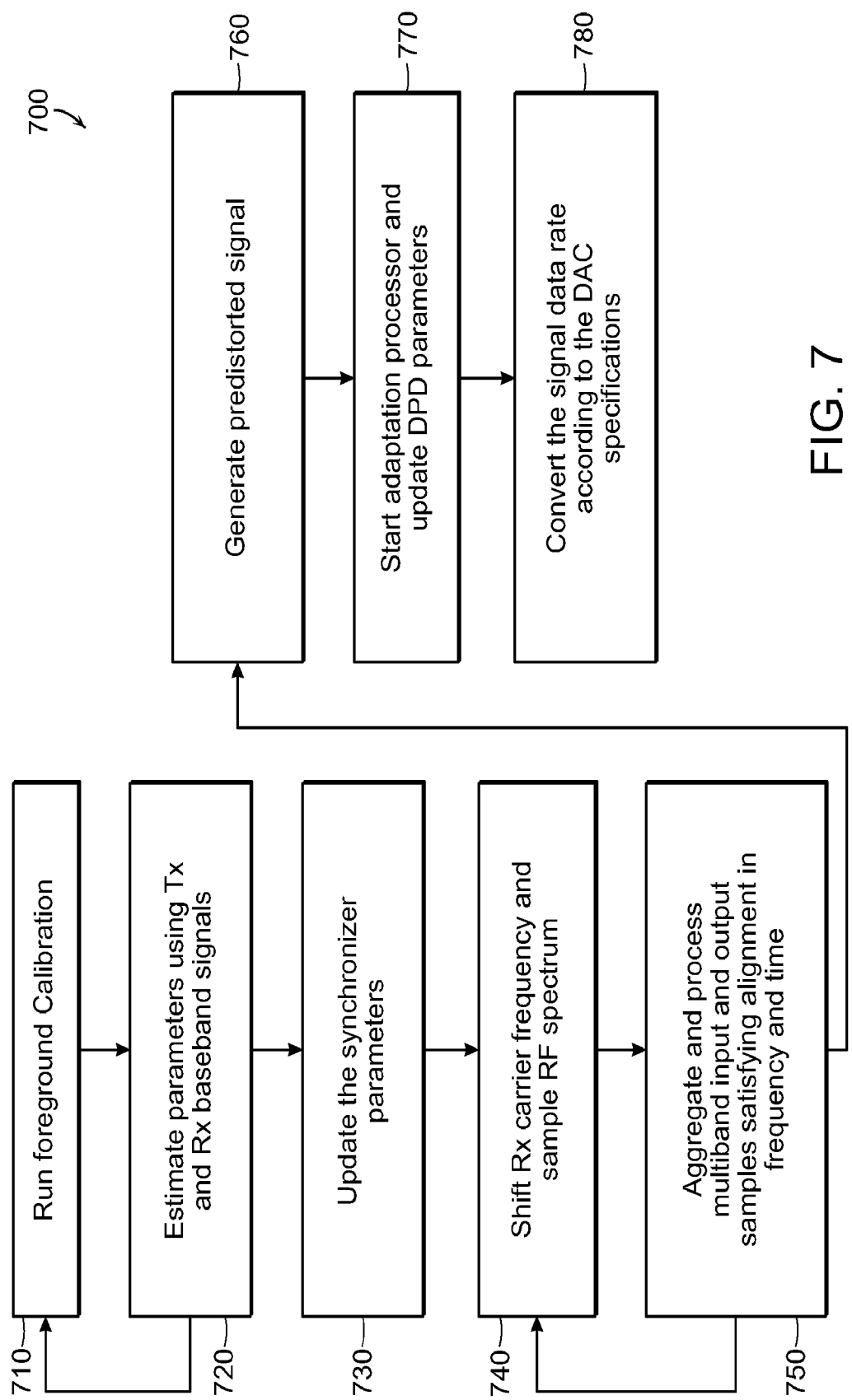
FIG. 7 is a flow diagram of another example procedure for digital predistortion of multiband signals.

With reference now to FIG. 7, a flow diagram of an example procedure 700 for digital predistortion of multiband signals is shown. Embodiments of the example procedure 700 may correspond to more particular implementations (or portions thereof) of the procedure 600 described in relation to FIG. 6, and may be realized using, for example, a system such as the system 300 depicted in FIG. 3. As shown in FIG. 7, the procedure 700 runs a foreground calibration process (at 710), and estimates calibration parameter (at 720), using Tx and Rx baseband signals (e.g., the signals Tx_SRC and Rx_SRC illustrated in FIG. 3) in order to determine such parameters as the system delay (e.g., the delay caused by the processing performed on input signals to produce output signal), gain, phase, etc. The calibration processing, implemented through the operations at the boxes 710 and 720 (which may be realized, in the example system implementation 300 of FIG. 3, by the foreground calibration unit 332) may be iterative, and may continue until some error measure (computed based on the estimated parameters and the input and output signals) is achieved. The estimated calibration parameters are used to update the synchronizer (e.g., the real-time synchronizer 334 of FIG. 3) used for synchronizing (correlating) the input signals (e.g., Tx_SRC in FIG. 3) and the observed output signals (e.g., Rx_SRC in FIG. 3) in order to allow, for example, accurate DPD adaptation operations to be performed.

The procedure 700 further includes shifting the Rx carrier frequencies (e.g., of observed output signals of the multiband digital predistortion systems described herein) and sampling the frequency shifted signals (at 740), and aggregating (condensing) and processing the multiband input and output samples satisfying alignment (based on the calibration and synchronization processes performed) in frequency and time (at 750). The condensing and sampling operations performed on the input and output signals may be repeated until some alignment criterion is achieved.

At 760, predistortion operations are performed (e.g., using a DPD processor such as the digital predistorter 324 of FIG. 3, or the processors 130 or 230 of FIGS. 1 and 2, respectively) to generate predistorted output signals (e.g., Tx_2 or $u_{DPD}$ at the output of the digital predistorter 324 in FIG. 3). The predistorted output may then be used both for the adaptation process (e.g., the predistorted output may be directed to the adaptation processor 328 of FIG. 3 in order to compute and update DPD parameters), as shown in box 770, and to generate the output of the system (e.g., the predistorted output being directed to the multi-rate converter, and the transmit chain of the system 300 of FIG. 3), as shown in box 780.

Figure 8:
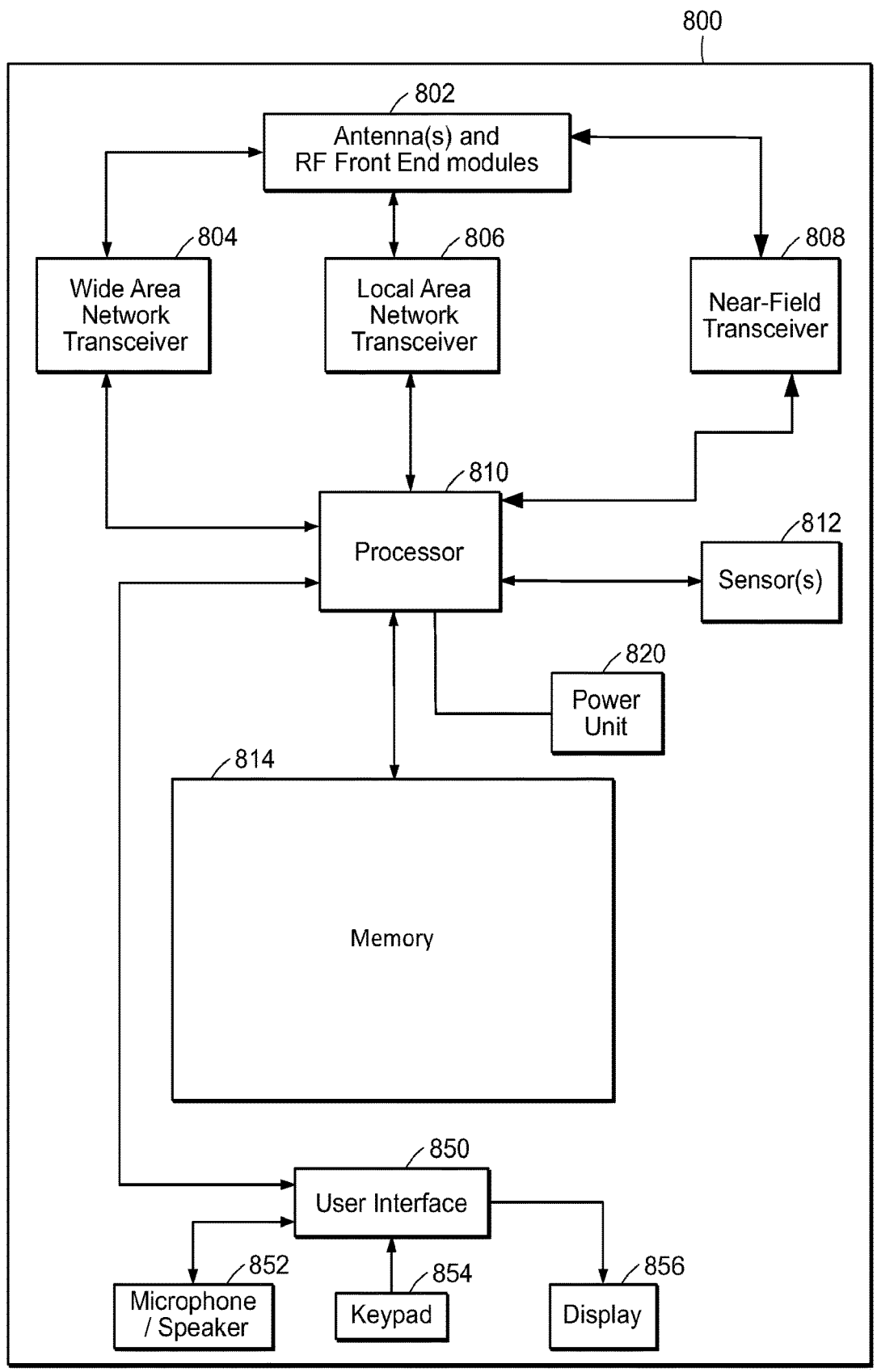
FIG. 8 is a schematic diagram of an example device (e.g., a mobile device or handset, a network node, etc.), which may be used to implement multiband digital predistortion functionality.

With reference next to FIG. 8, a schematic diagram of an example device 800 (e.g., a mobile device or handset, a network node, such as a WLAN access point or a WWAN base station, etc.), which may be used to implement, or which may include, the multiband digital predistortion implementations described herein in relation to FIGS. 1-7 is shown. It is to be noted that one or more of the modules and/or functions illustrated in the example device of FIG. 8 may be further subdivided, or two or more of the modules or functions illustrated in FIG. 8 may be combined. Additionally, one or more of the modules or functions illustrated in FIG. 8 may be excluded.

As shown, the example device 800 may include a communication module comprising one or more transceivers (e.g., a WLAN transceiver 806, a WWAN transceiver 804, a near-range transceiver 808, etc.) that may be connected to one or more antennas and RF front end modules (illustrated as block 802). The RF front end circuitry of the block 802 may include power amplifiers, LNAs, switches and other RF front-end modules, and, in some embodiments, at least some of the RF front end modules may be arranged to realize, at least in part, the system implementations 100, 200, or 300 described herein. The transceivers 804, and 806, and/or 808 may comprise suitable devices, hardware, and/or software for communicating with and/or detecting signals to/from a network or remote devices. For example, the transceivers may include digital-to-analog converters, analog-to-digital converters, frequency modulators, and other hardware to realize, for example, the multiband digital predistortion system implementations described herein. In some embodiments, the transceiver 806 may support wireless LAN communication (e.g., WLAN, such as WiFi-based communications) to thus cause the device 800 to be part of a WLAN. Any type of WLAN-based protocol may be supported by the transceiver 806. In some embodiments, the transceiver 804 may support the device 800 to communicate with one or more cellular access points (also referred to as a base station), which may be used for wireless voice and/or data communication. The transceiver 804 may be used to communicate according to any type of WWAN protocol, including any 3GPP or IEEE standards (implemented over licensed and unlicensed frequency bands). In some variations, the device 800 may also include the near-range transceiver (interface) 808 configured to allow the device 800 to communicate with in-range remote devices configured according to any near-range communication protocol. In addition, the device 800 may also include a wired network connection (e.g., implemented using a USB port, or some other wired port) to communicate with another device.

In some embodiments, the device 800 may include one or more sensors 812 that communicate with a controller/processor 810 through wired or wireless communication links. The one or more sensors 812 may include motion/orientation sensors, an audio sensor (e.g., a microphone), a camera or some other type of optical sensors (e.g., a charge-couple device (CCD)-type camera, a CMOS-based image sensor, etc., which may produce still or moving images that may be displayed on a user interface device), and/or other types of sensors.

The controller/processor 810 may be connected to the transceivers 804, 806, and/or 808, and the one or more sensors 812. The processor may include one or more microprocessors, microcontrollers, and/or digital signal processors that provide processing functions, as well as other computation and control functionality. The device 800 may also include special purpose logic circuitry, e.g., an FPGA (field programmable gate array), an ASIC (application-specific integrated circuit), a DSP processor, a graphics processing unit (GPU), an accelerated processing unit (APU), an application processor, customized dedicated circuity, etc., to implement, at least in part, the processes and functionality for the device 800. The processor 810 may also include memory 814 (computer accessible storage medium) for storing data and software instructions for executing programmed functionality within the device. Generally speaking, a computer accessible storage medium may include any non-transitory storage media accessible by a computer during use to provide instructions and/or data to the computer. For example, a computer accessible storage medium may include storage media such as magnetic or optical disks and semiconductor (solid-state) memories, DRAM, SRAM, etc.

The device 800 may be configured to (e.g., via hardware resident in the device and/or software modules/applications provided on the memory 814) to implement multiband digital predistortion processing, e.g., according to the procedures described herein, including the procedures depicted in FIGS. 6 and 7. The memory 814 may be on-board the controller/processor 810 (e.g., within the same IC package), and/or may be external memory to the processor and coupled thereto over a data bus.

The example device 800 may further include a user interface 850 which provides any suitable interface systems, such as a microphone/speaker 852, keypad or touchscreen 854 (or some other user-interface input mechanism), and display 856 that allows user interaction with the device 800. Such a user interface, be it an audiovisual interface (e.g., a display and speakers), or some other type of interface (visual-only, audio-only, tactile, etc.), configured to provide status data, alert data, and so on, to a user using the device 800. The microphone/speaker 852 provides for voice communication functionality, and may also include or be coupled to a speech synthesizer (e.g., a text-to-speech module) that can convert text data to audio speech so that the user can receive audio notifications. Such a speech synthesizer may be a separate module, or may be integrally coupled to the microphone/speaker 852 or to the processor 810 of the device of FIG. 8. The keypad 854 includes suitable buttons for user input. The display 856 includes any suitable display, such as, for example, a backlit LCD display, and may further include a touch screen display for additional user input modes. The device 800 may further include a power unit 820 such as one or more batteries and/or a power conversion module that receives and regulates power from an outside source (e.g., AC power).

The above implementations, as illustrated in FIGS. 1-8, are applicable to a wide range of technologies that include RF technologies (including WWAN technologies, such as cellular technologies, and WLAN technologies), satellite communication technologies, cable modem technologies, wired network technologies, optical communication technologies, and all other RF and non-RF communication technologies. The implementations described herein encompass all techniques and embodiments that pertain to use of multiband digital predistortion in various different communication systems.

In some implementations, a computer accessible non-transitory storage medium includes a database (also referred to a "design structure" or "integrated circuit definition dataset") representative of a system including some or all of the components of the multiband digital predistortion implementations for the systems described herein. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high-level design language (HDL) such as Verilog or VHDL. The description may be read by a synthesis tool which may synthesize the description to produce a netlist comprising a list of gates from a synthesis library. The netlist comprises a set of gates which also represents the functionality of the hardware comprising the system. The netlist may then be placed and routed to produce a data set describing geometric shapes to be applied to masks. The masks may then be used in various semiconductor fabrication steps to produce a semiconductor circuit or circuits corresponding to the system. In other examples, the database may itself be the netlist (with or without the synthesis library) or the data set.

Unless defined otherwise, all technical and scientific terms used herein have the same meaning as commonly or conventionally understood. As used herein, the articles "a" and "an" refer to one or to more than one (i.e., to at least one) of the grammatical object of the article. By way of example, "an element" means one element or more than one element. "About" and/or "approximately" as used herein when referring to a measurable value such as an amount, a temporal duration, and the like, encompasses variations of ±20% or ±10%, ±5%, or +0.1% from the specified value, as such variations are appropriate in the context of the systems, devices, circuits, methods, and other implementations described herein. "Substantially" as used herein when referring to a measurable value such as an amount, a temporal duration, a physical attribute (such as frequency), and the like, also encompasses variations of ±20% or ±10%, ±5%, or +0.1% from the specified value, as such variations are appropriate in the context of the systems, devices, circuits, methods, and other implementations described herein.

As used herein, including in the claims, "or" as used in a list of items prefaced by "at least one of" or "one or more of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.). Also, as used herein, unless otherwise stated, a statement that a function or operation is "based on" an item or condition means that the function or operation is based on the stated item or condition and may be based on one or more items and/or conditions in addition to the stated item or condition.

Although particular embodiments have been disclosed herein in detail, this has been done by way of example for purposes of illustration only, and is not intended to be limit the scope of the invention, which is defined by the scope of the appended claims. Features of the disclosed embodiments can be combined, rearranged, etc., within the scope of the invention to produce more embodiments. Some other aspects, advantages, and modifications are considered to be within the scope of the claims provided below. The claims presented are representative of at least some of the embodiments and features disclosed herein. Other unclaimed embodiments and features are also contemplated.

What is claimed is:

1. A method for digital predistortion of multiband signals, the method comprising:
   receiving a plurality of input signals respectively in multiple different frequency bands, the plurality of input signals occupying an input frequency span equal to a difference between a maximum frequency in a highest of the multiple different bands and a minimum frequency in a lowest of the multiple different bands;
   frequency shifting at least one signal from the plurality of input signals to produce condensed shifted signals, each corresponding to a respective one of the plurality of input signals, occupying a condensed frequency span smaller than the input frequency span; and
   processing the condensed shifted signals, including applying digital predistortion to the condensed shifted signals.

2. The method of claim 1, wherein processing the condensed shifted signals further comprises:
   sampling the condensed shifted signals at a sampling rate equal to or exceeding an aggregate minimum rate required for the condensed shifted signals, the sampling rate being less than an input minimum rate required for the plurality of input signals in the multiple different bands.

3. The method of claim 1, wherein processing the condensed shifted signals further comprises:
   sampling individual signals in the condensed shifted signals according to respective ones of a plurality multirate sampling conversions determined for each of the condensed shifted signals.

4. The method of claim 1, wherein processing the condensed shifted signals, including applying digital predistortion to the condensed shifted signals, comprises:
   applying the digital predistortion to the condensed shifted signals so that resultant amplified condensed shifted signals, resulting from inputting the digital predistorted condensed shifted signals to a transmit chain comprising at least one power amplifier causing non-linearity distortions, comprise magnified copies of the plurality of input signals substantially free of non-linear distortions.

5. The method of claim 1, wherein processing the condensed shifted signals further comprises:
frequency shifting the digitally predistorted condensed shifted signals to produce predistorted output signals with a resultant frequency span equal to the input frequency span for the multiple different bands of the plurality of input signals.

6. The method of claim 5, further comprising:
amplifying each of the predistorted output signals using a respective one of a plurality of power amplifiers configured for operation in a respective frequency band associated with the each of the predistorted output signals.

7. The method of claim 5, further comprising:
amplifying each of the predistorted output signals using a single power amplifier configured for operation in the multiple different bands.

8. The method of claim 1, further comprising:
periodically adjusting digital predistortion parameters controlling operations of the digital predistortion applied to the condensed shifted signals based at least on one of: the condensed shifted signals, the digitally predistorted condensed shifted signals, or observed copies of amplified output signals produced from amplifying and frequency shifting the digital predistorted output signals using one or more power amplifiers.

9. The method of claim 8, wherein periodically adjusting the digital predistortion parameters comprises:
deriving the digital predistortion parameters that result in a minimization of a difference between frequency shifted amplified output signals produced from frequency shifting of the amplified output signals, and the condensed shifted signals produced from frequency shifting the at least one signal from the plurality of input signals.

10. The method of claim 1, wherein at least two neighboring bands of the plurality of input signals are non-contiguous.

11. The method of claim 1, wherein frequency shifting the at least one signal from the plurality of input signals to produce the condensed shifted signals comprises frequency shifting the at least one signal to produce a narrower frequency window, occupying an aggregate of signals that each corresponds to one of the plurality of input signals, than the original input frequency span occupied by the plurality of input signals, respectively associated with the multiple different bands, prior to the frequency shifting;
and wherein processing the condensed shifted signals comprises applying digital predistortion to the aggregate of signals within the narrower frequency window to pre-invert non-linear signal distortions caused by a transmit chain operating on the aggregate of signals within the narrower frequency window.

12. A system for digital predistortion of multiband signals, the system comprising:
at least one communication module to receive a plurality of input signals respectively in multiple different frequency bands, the plurality of input signals occupying an input frequency span equal to a difference between a maximum frequency in a highest of the multiple different bands and a minimum frequency in a lowest of the multiple different bands;
a frequency shifting circuit to frequency shift at least one signal from the plurality of input signals to produce condensed shifted signals, each corresponding to a respective one of the plurality of input signals, occupying a condensed frequency span smaller than the input frequency span; and
a processor to process the condensed shifted signals, including to apply digital predistortion to the condensed shifted signals.

13. The system of claim 12, wherein the processor configured to process the condensed shifted signals is further configured to:
sample the condensed shifted signals at a sampling rate equal to or exceeding an aggregate minimum rate required for the condensed shifted signals, the sampling rate being less than an input minimum rate required for the plurality of input signals in the multiple different bands.

14. The system of claim 12, wherein the processor configured to process the condensed shifted signals is further configured to:
sample individual signals in the condensed shifted signals according to respective ones of a plurality multirate sampling conversions determined for each of the condensed shifted signals.

15. The system of claim 12, wherein the processor configured to process the condensed shifted signals, including to apply digital predistortion to the condensed shifted signals, is configured to:
apply the digital predistortion to the condensed shifted signals so that resultant amplified condensed shifted signals, resulting from inputting the digital predistorted condensed shifted signals to a transmit chain comprising at least one power amplifier causing non-linearity distortions, comprise magnified copies of the plurality of input signals substantially free of non-linear distortions.

16. The system of claim 12, wherein the processor configured to process the condensed shifted signals is further configured to:
frequency shift the digitally predistorted condensed shifted signals to produce predistorted output signals with a resultant frequency span equal to the input frequency span for the multiple different bands of the plurality of input signals.

17. The system of claim 16, further comprising:
a plurality of power amplifiers to respectively amplify each of the predistorted output signals.

18. The system of claim 16, further comprising:
a single power amplifier, configured for operation in the multiple different bands, to amplify each of the predistorted output signals.

19. The system of claim 12, wherein the processor is further configured to:
periodically adjust digital predistortion parameters controlling operations of the digital predistortion applied to the condensed shifted signals based at least on one of: the condensed shifted signals, the digitally predistorted condensed shifted signals, or observed copies of amplified output signals produced from amplifying and frequency shifting the digital predistorted output signals using one or more power amplifiers.

20. A non-transitory machine-readable medium storing a design structure comprising elements that, when processed in a computer-aided design system, generate a machine-executable representation of a multiband system that is used to fabricate hardware comprising:
a receiving circuit to receive a plurality of input signals respectively in multiple different frequency bands, the plurality of input signals occupying an input frequency span equal to a difference between a maximum frequency in a highest of the multiple different bands and a minimum frequency in a lowest of the multiple different bands;

a frequency shifting circuit to frequency shift at least one signal from the plurality of input signals to produce condensed shifted signals, each corresponding to a respective one of the plurality of input signals, occupying a condensed frequency span smaller than the input frequency span; and a processing circuit to process the condensed shifted signals, including to apply digital predistortion to the condensed shifted signals.

21. A non-transitory computer readable media programmed with a set of computer instructions executable on a processor, to:

receive a plurality of input signals respectively in multiple different frequency bands, the plurality of input signals occupying an input frequency span equal to a difference between a maximum frequency in a highest of the multiple different bands and a minimum frequency in a lowest of the multiple different bands;

frequency shift at least one signal from the plurality of input signals to produce condensed shifted signals, each corresponding to a respective one of the plurality of input signals, occupying a condensed frequency span smaller than the input frequency span; and process the condensed shifted signals, including apply digital predistortion to the condensed shifted signals.

* * * * *